(12) United States Patent
Menkhoff et al.

(10) Patent No.: US 10,116,341 B1
(45) Date of Patent: Oct. 30, 2018

(54) POLAR TRANSMITTER WITH JOINED MODULATOR

(71) Applicant: Intel IP Corporation, Santa Clara, CA (US)

(72) Inventors: Andreas Menkhoff, By (DE); Stephan Henzler, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/639,444

(22) Filed: Jun. 30, 2017

(51) Int. Cl.
*H04B 1/04* (2006.01)
*H04W 16/26* (2009.01)
*H04W 52/02* (2009.01)
*H04W 52/52* (2009.01)

(52) U.S. Cl.
CPC .......... *H04B 1/0475* (2013.01); *H04W 16/26* (2013.01); *H04W 52/0206* (2013.01); *H04W 52/52* (2013.01); *H04B 2001/045* (2013.01); *H04B 2001/0425* (2013.01)

(58) Field of Classification Search
CPC . H04B 1/0475; H04W 16/26; H04W 52/0206
See application file for complete search history.

(56) References Cited

U.S. PATENT DOCUMENTS

| | | | |
|---|---|---|---|
| 7,816,959 B1 | 10/2010 | Isik | |
| 2003/0129959 A1 | 7/2003 | Gilmore | |
| 2005/0190854 A1* | 9/2005 | Shakeshaft | H03C 3/40 |
| | | | 375/295 |
| 2007/0201581 A1 | 8/2007 | Wagh et al. | |
| 2008/0068231 A1 | 3/2008 | Kuhns | |
| 2010/0052781 A1* | 3/2010 | Nentwig | H03F 1/0227 |
| | | | 330/149 |
| 2010/0233977 A1 | 9/2010 | Minnis et al. | |
| 2012/0056676 A1* | 3/2012 | Frambach | H03F 3/193 |
| | | | 330/295 |
| 2012/0213177 A1 | 8/2012 | Lee et al. | |
| 2012/0243637 A1 | 9/2012 | Sorrells et al. | |
| 2015/0171848 A1 | 6/2015 | Bruennert et al. | |

(Continued)

FOREIGN PATENT DOCUMENTS

WO 2017/095492 A1 6/2017

OTHER PUBLICATIONS

Search Report dated Jul. 26, 2018 for International Application No. PCT/US18/32301.

*Primary Examiner* — Jaison Joseph
(74) *Attorney, Agent, or Firm* — Schiff Hardin LLP

(57) ABSTRACT

An apparatus and a method for transmitting a signal over a wireless channel using a device including a polar transmitter joinable with a modulator are disclosed. For example, the method, by a circuit of the device, generates first and second streams of data from received data based on a type of modulator, a type of combiner and a channel frequency, each stream having at least some portion of the received data that is distinct from data included in the other stream, the type of combiner comprising a multiplicative or an additive combiner, the method, by the circuit, generates a first analog signal based on the first stream and generates a supply voltage based on the second stream, and the method by an amplifier coupled to the circuit, generates a Radio Frequency (RF) signal based on the supply voltage and the type of combiner.

25 Claims, 18 Drawing Sheets

(56) References Cited

U.S. PATENT DOCUMENTS

2016/0094235 A1    3/2016   Kuttner et al.
2016/0141007 A1    5/2016   Tu
2016/0285587 A1    9/2016   Noest et al.

* cited by examiner

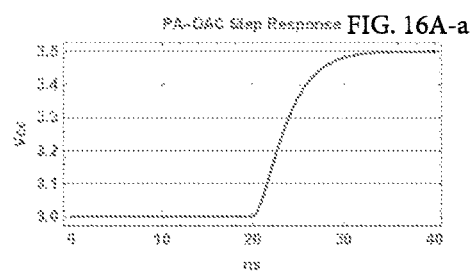
FIG. 16A-a
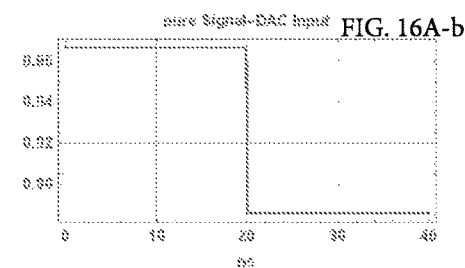
FIG. 16A-b
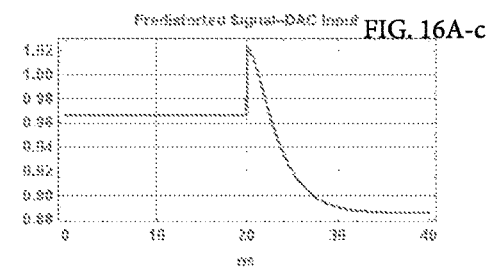
FIG. 16A-c
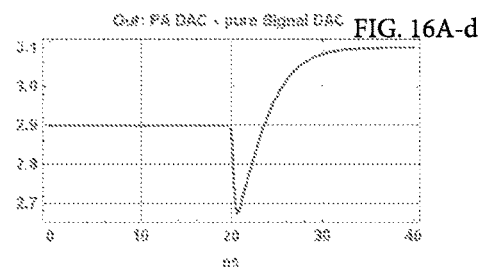
FIG. 16A-d
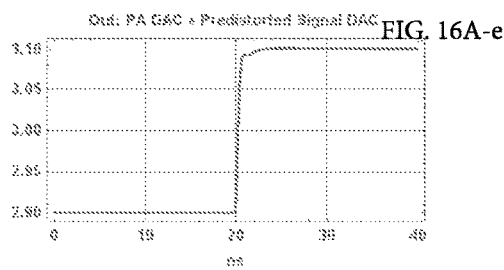
FIG. 16A-e

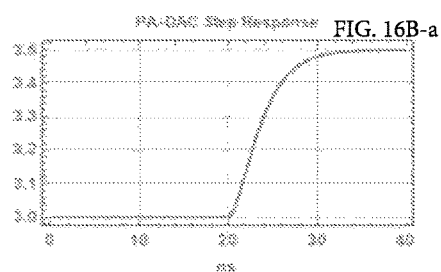
FIG. 16B-a
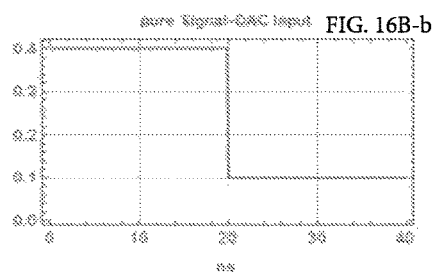
FIG. 16B-b
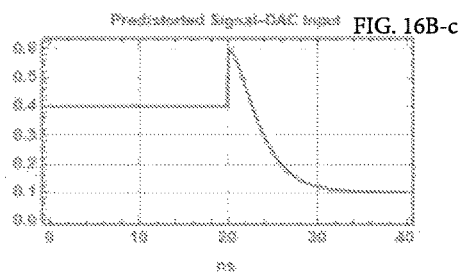
FIG. 16B-c
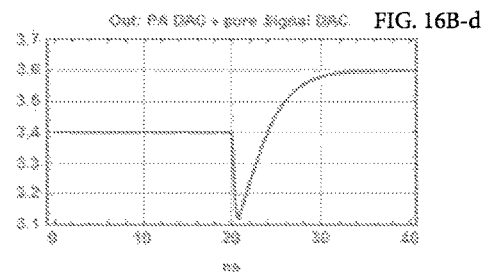
FIG. 16B-d
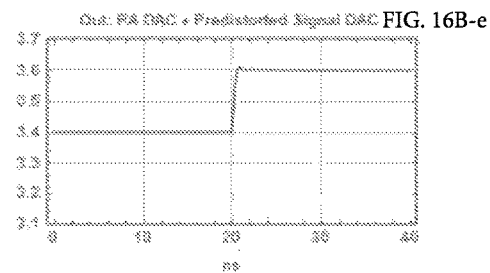
FIG. 16B-e

POLAR TRANSMITTER WITH JOINED MODULATOR

The present disclosure describes a method and an apparatus for joining (i.e., combining) a polar transmitter with a modulator. Although, the method is described for combining a polar transmitter with a modulator in a device transmitting and/or receiving wireless signals over a wireless channel of a Long Term Evolution (LTE) network, the method may be implemented for signals transmitted and/or received over any type of wireless network, e.g., a 3G network, a 5G network, a Wi-Fi network, and the like.

BACKGROUND

As wireless network traffic rises, Radio Access Technologies (RATs) evolve to support higher and higher bandwidths. Modern RATs may satisfy bandwidth requirements with standards established for various frequency bands. For example, new frequency bands may be allocated to provide additional bandwidth. However, often the new frequency bands are allocated at higher frequencies and consequently have smaller coverage areas.

One way to increase the coverage area is to increase the output power of devices. However, increasing the output power of a device reduces the power efficiency of the device. A first approach to mitigate for the decrease in power efficiency is to design a device using: a polar modulator with one Digital-to-Analog Converter (DAC), and a Local Oscillator (LO) that provides a clock signal to the DAC at a minimum rate. The input signal to the Power Amplifier (PA) of the device may vary only in phase. The power supply to the PA is fed through a Direct Current-to-Direct Current (DC-DC) converter. Then, amplitude modulation may be performed by adjusting the gain of the PA. The gain of the PA is adjusted by modulating the supply voltage based on tracking envelope information of the received data. Unfortunately, an envelope tracking power supply requires a feedback mechanism for accuracy. The feedback mechanism increases the silicon area and introduces design problems for supporting higher bandwidth.

A second approach to mitigate for the decrease in power efficiency is to use a polar transmitter in which the PA is directly modulated. The direct modulation of the PA is performed by feeding the entire radius to the PA through the continuous power supply, and by feeding a modulated carrier signal with fixed amplitude to the signal input of the PA. A cellular system has an adjustable gain range of about 80 dB and the PA has gain dispersion. Hence, no current gain values can be set at lower amplitudes. Directly modulating the PA may reduce power dissipation to a certain extent. However, the far off noise of the directly modulated PA is low. As such, the first and second approaches are sub-optimal for transmitters intended to support high bandwidth.

BRIEF DESCRIPTION OF THE DRAWINGS

The teaching of the present disclosure can be more fully understood by reading the subsequent detailed description and examples in conjunction with references made to the accompanying drawings, in which:

FIG. 16A-a-FIG. 16A-e illustrates an execution example of a pre-distortion to compensate for a slow response of a PA DAC, when the combiner is multiplicative, in accordance with an exemplary aspect of the present disclosure; and FIG. 16B-a-FIG. 16B-e illustrates an execution example of a pre-distortion to compensate for a slow response of a PA DAC, when the combiner is additive, in accordance with an exemplary aspect of the present disclosure.

To facilitate reading, identical reference numbers are used to designate elements that are common to various figures, where possible.

DETAILED DESCRIPTION

The present disclosure relates to combining a polar transmitter with a modulator. For example, in one aspect of the present disclosure, the polar transmitter may be combined with a polar modulator or an In-phase and Quadrature (IQ) modulator, e.g., a digital IQ modulator, an analog IQ modulator, a Direct Digital Synthesizer (DDS) modulator, and the like.

As described above, improving the efficiency of transmitters is desirable and the approaches described above are sub-optimal. In the first approach, the transmitter is built with a polar modulator with one DAC, and an LO that provides a clock signal to the DAC. The DAC transmits a Rayleigh distributed signal to the PA and the input signal to the PA (i.e., the Rayleigh distributed signal received from the DAC) varies in phase. The PA receives a constant supply voltage, e.g., Vcc. When a PA operates with a constant voltage, the efficiency is maximized when operating at peak power. Conversely, when the PA is operating below peak power, it becomes less efficient. The gain of the PA is adjusted by modulating the supply voltage.

In order to increase the efficiency, the voltage applied to the PA may be adjusted for delivering the amount of power needed by the PA at each instant of transmission. The envelope tracking scheme is used for determining the appropriate level of the constant voltage from the signal to be transmitted at a given instant of transmission. For example, a processor, e.g., a baseband processor or a Digital Front End (DFE), etc., may compute envelope information. In one example, the envelope information is computed from the In-phase (I) and Quadrature (Q) components of the input data. The processor may then provide the envelope information to a power supply which generates and delivers the required constant supply voltage, based on the envelope information. In order to ensure that the envelope tracking power supply closely tracks the PA, the gain of the PA is provided to the power supply. That is, a feedback mechanism may be included. However, as described above, an envelope tracking power supply that includes a feedback mechanism requires a bigger silicon area and introduces problems for supporting higher bandwidth.

Similarly, the second approach to mitigate for the decrease in power efficiency is sub-optimal. Recall that the second approach is to use a polar transmitter in which the PA is directly modulated. As described above, a directly modulated PA has a low far off noise and is sub-optimal for high bandwidth applications.

The present disclosure describes an apparatus and a method for combining a polar transmitter with a modulator. The polar transmitter that is combined with the modulator in accordance with the present disclosure provides improved power efficiency while providing a good far off noise. In other words, the apparatus enables a transmitter of a device to support high bandwidth services, while conserving power and providing a good far off noise.

Figure 1:
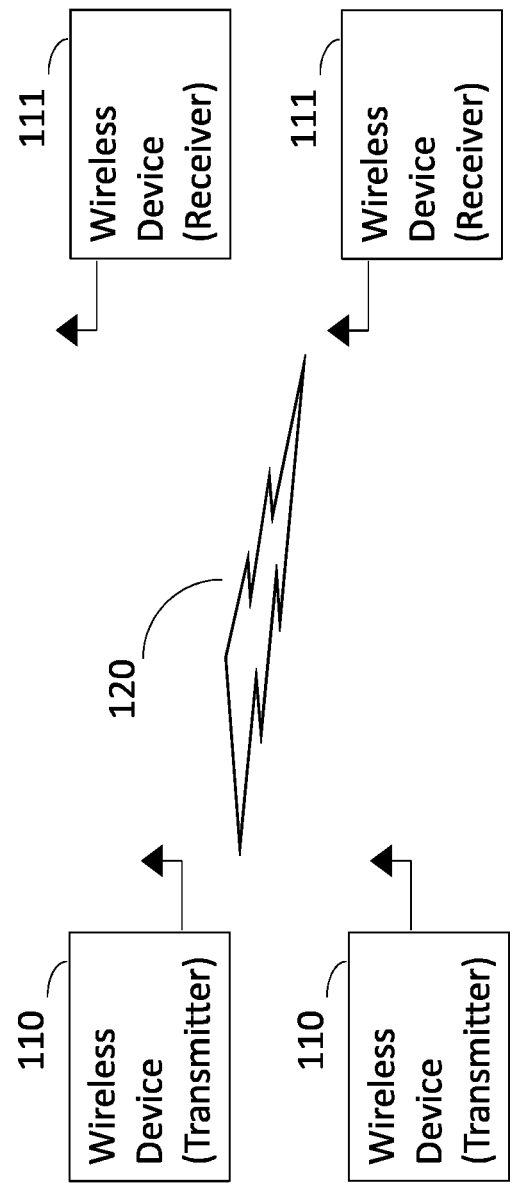
FIG. 1 illustrates a wireless network for providing services to wireless devices in accordance with an exemplary aspect of the present disclosure.

FIG. 1 illustrates a wireless network 100 for providing services to wireless devices in accordance with an exemplary aspect of the present disclosure. The wireless network comprises transmitter wireless devices 110 and receiver wireless devices 111 communicating over a wireless channel 120. For example, the wireless device 110 or 111 may be a user equipment. In addition, the wireless device may be a base station. It is noted that the antennas of the wireless devices 110 and 111 may be antennas of a transceiver that may be used for both transmitting and receiving of a wireless signal. As such, each wireless device may be a device for transmitting or receiving the wireless signal, based on whether a Radio Frequency (RF) signal is transmitted or received by the device.

A transmitter of a wireless device 110, includes several components. For example, the transmitter may include one or more of: a modulator, a pre-distorter, an oscillator, an amplifier, an adder, Digital-to-Analog (DAC) converter (e.g., RF DAC, a Power Amplifier (PA) DAC, an I DAC and Q DAC pair, a signal DAC, a Direct Digital Synthesizer (DDS) DAC, a Local Oscillator (LO) DAC, and the like), a post-filter, a mixer, a duplexer, an antenna, etc. For clarity, the "power amplifier" of the present disclosure may simply be referred to as an "amplifier".

Figure 2:
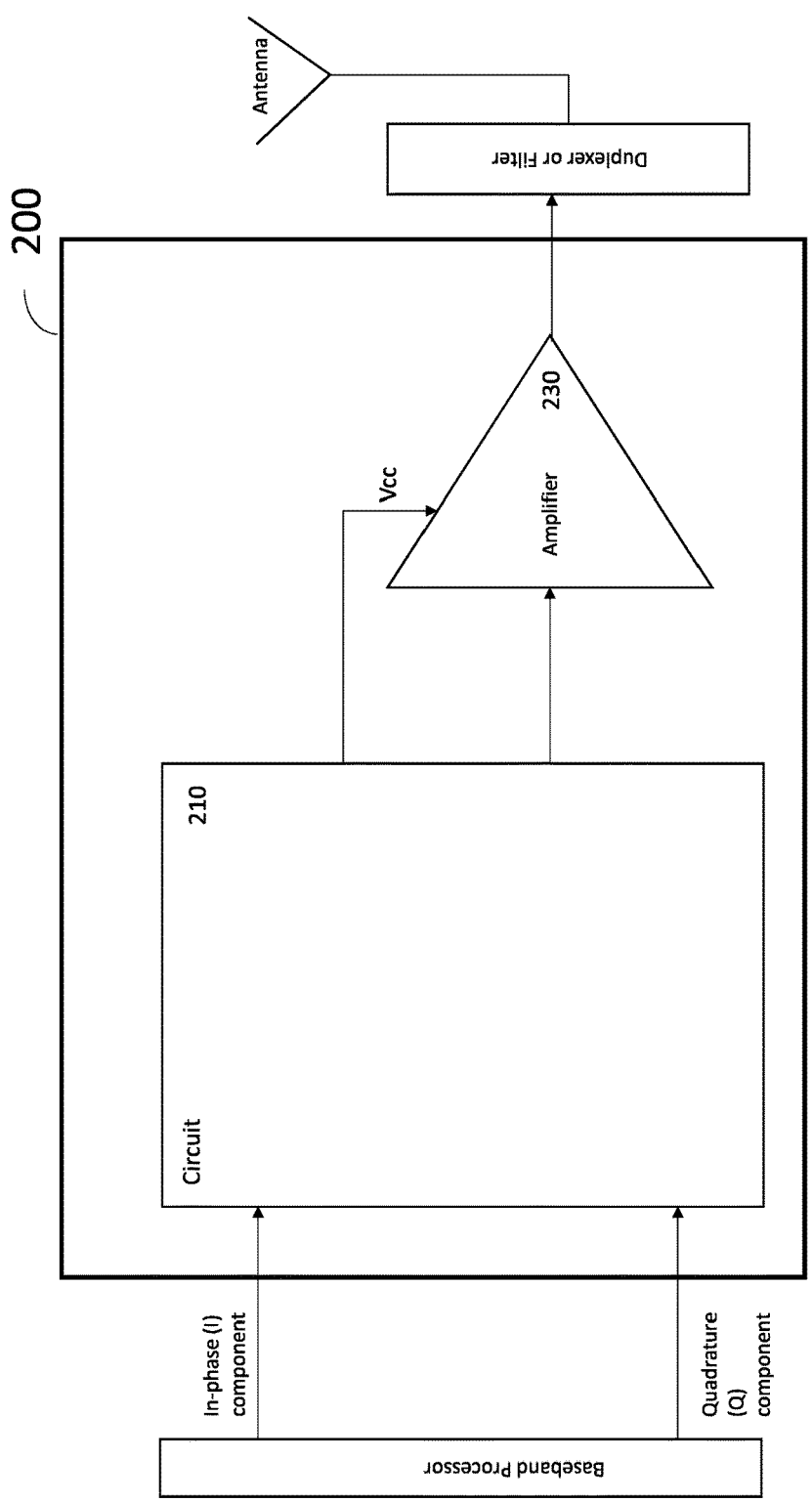
FIG. 2 illustrates an apparatus for joining a polar transmitter with a modulator in accordance with an exemplary aspect of the present disclosure.

FIG. 2 illustrates an apparatus 200 for joining a polar transmitter with a modulator in accordance with an exemplary aspect of the present disclosure. The apparatus 200 is operable to transmit a signal over a wireless channel, e.g., over a wireless channel of an LTE network. The apparatus 200 is comprised within each transmitter wireless device 110 described above with respect to FIG. 1. The apparatus 200 comprises a circuit 210 and an amplifier 230.

Figure 3A:
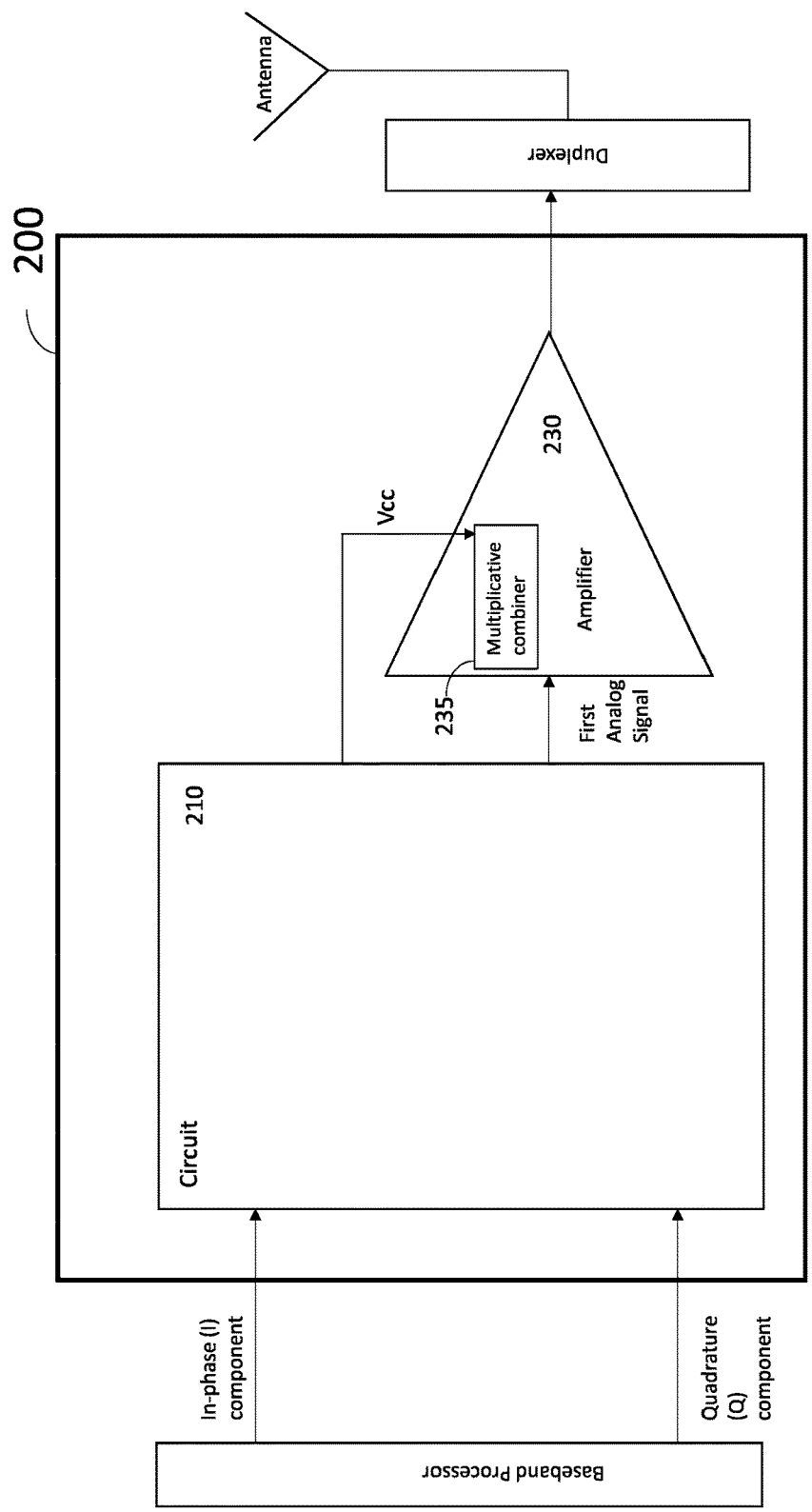
FIG. 3A illustrates a multiplicative combiner arranged to be integrated with an amplifier in accordance with an exemplary aspect of the present disclosure.
Figure 3B:
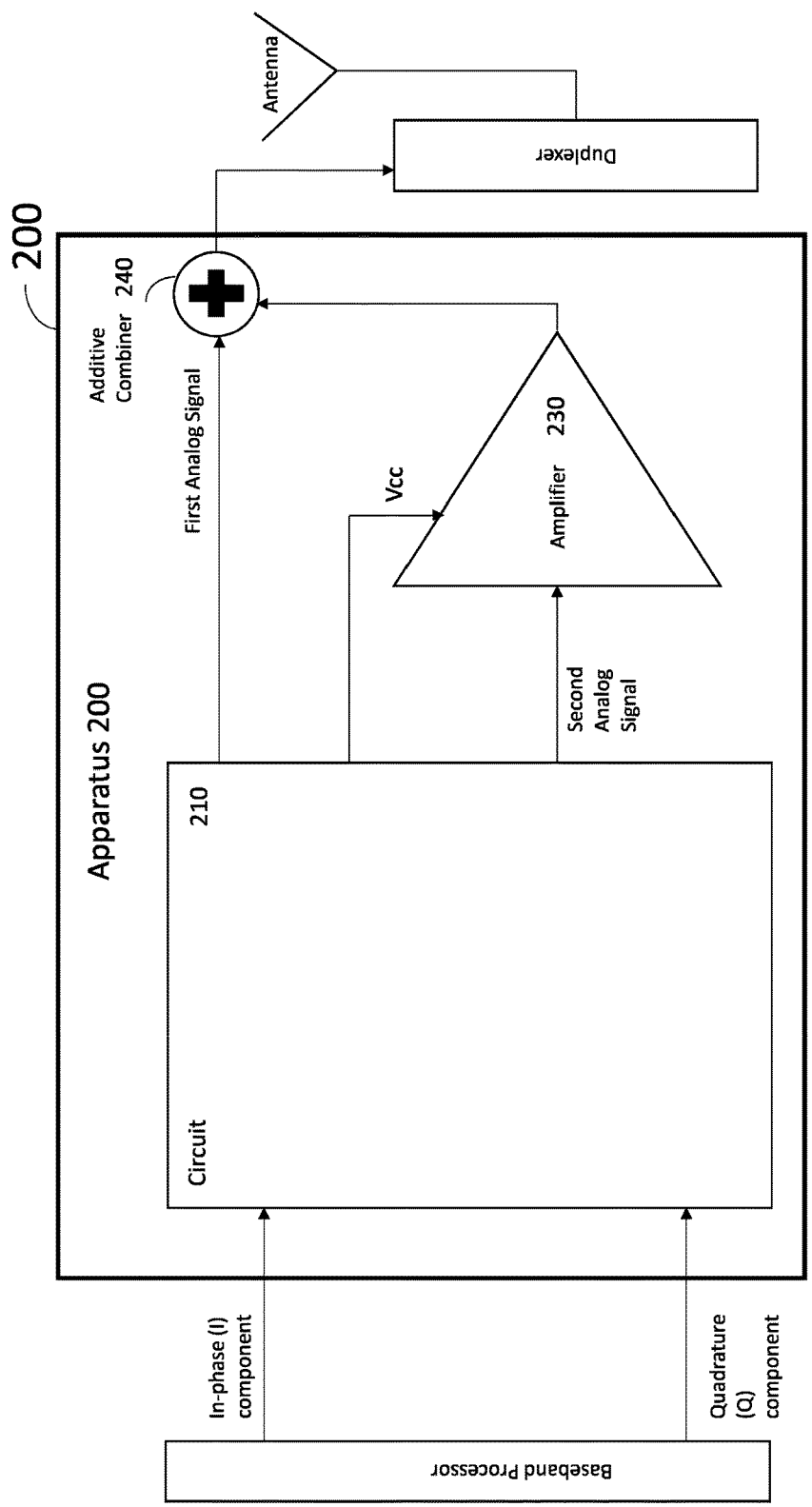
FIG. 3B illustrates a additive combiner arranged to be coupled to an amplifier in accordance with an exemplary aspect of the present disclosure.

The circuit 210 is coupled to the amplifier 230. The amplifier 230 is communicatively coupled to at least one transmit antenna, via a duplexer. The amplifier may be coupled to the duplexer directly, e.g., as illustrated in FIG. 3A, or through an additive combiner, as illustrated in FIG. 3B.

The circuit 210, based on a type of modulator, a type of combiner and a channel frequency, is configured to generate first and second streams of data from received data, to generate a first analog signal based on the first stream, and to generate a supply voltage, e.g., a constant supply voltage Vcc, based on the second stream. The type of combiner comprises a multiplicative or an additive combiner. In addition, each of the first and second streams has at least some portion of the received data that is distinct from data included in the other stream. In other words, information included in the first stream cannot be entirely derivable from the second stream. Similarly, information included in the second stream cannot be entirely derivable from the first stream. Examples C1 and C2, described in Section "C", illustrate the concepts of additive and multiplicative combining.

In one aspect, the circuit 210 comprises a preprocessor configured to receive and preprocess the received data prior to generating the first and second streams of data. The first and second streams of data are then generated based on the preprocessed data. For example, the data may be received from a baseband processor in any known format. In one aspect, preprocessing comprises converting the received data to a format appropriate for the polar transmitter that is joined with the modulator in accordance with the present disclosure.

In one aspect, the received data comprises in-phase and quadrature components. The in-phase and quadrature components of the received data are collectively referred to as "IQ data." In another aspect, the received data comprises polar data. The polar data includes radius and phase data.

In one aspect, the received data is converted to another format based on the type of modulator and the format of the received data (e.g., IQ data or polar data). For example, when the received data is IQ data and the modulator is a polar modulator, the IQ data may be converted to polar data. Similarly, when the received data is polar data and the modulator is an IQ modulator, the polar data may be converted to the equivalent IQ data.

In one aspect, when the modulator is a polar modulator, the preprocessor is further configured to determine floating point radius values from the polar data. For example, when the received data is polar data, the floating point radius values may be determined directly. Similarly, when the received data is IQ data, the floating point radius values may be determined after converting the IQ data to the polar data.

It is noted that the first and second streams may contain some overlapping information. However, neither stream is merely for information that is already included in the other stream. In other words, the first and second streams have at least some non-overlapping information derived from the received data.

In one aspect, the apparatus 200 further comprises a multiplicative combiner 235 or an additive combiner 240. FIG. 3A illustrates a multiplicative combiner 235 arranged to be integrated with an amplifier in accordance with an exemplary aspect of the present disclosure. FIG. 3B illustrates an additive combiner 240 arranged to be coupled to an amplifier in accordance with an exemplary aspect of the present disclosure.

When the type of combiner is multiplicative, the multiplicative combiner 235 is configured to multiplicatively combine the first analog signal and the supply voltage. Then, the RF signal is generated based on the multiplicatively combined first analog signal and supply voltage. Example C2 illustrates the concept of multiplicative combining.

When the type of combiner is additive, the circuit 210 is further configured to generate a second analog signal. For example, the second analog signal may comprise a modulated clock signal having a constant amplitude generated via an oscillator. The clock signal is modulated based on the channel frequency. Then, the amplifier 230 generates the RF signal based on the second analog signal and the supply voltage. The additive combiner 240 is configured to combine the RF signal generated by the amplifier 230 with the first analog signal. The first analog signal that is additively combined with the RF signal is also a signal in the range of the radio frequency. Example C1 illustrates the concept of additive combining.

Returning to FIG. 2, the amplifier 230 is configured to generate the RF signal based on the supply voltage and the type of combiner.

As described above, the circuit 210 is configured based on a type of modulator, a type of combiner, and a channel frequency, and the type of modulator may comprise a polar or an IQ modulator. The joining of the polar transmitter with a modulator may be implemented in a variety of aspects based on application.

For ease of understanding, aspects for joining the polar transmitter with a polar modulator are described in Section A, and aspects for joining the polar transmitter with an IQ modulator are described in Section B. In other words, in Section A, circuit 210 is further refined for joining the polar transmitter with the polar modulator. Similarly, in Section B, circuit 210 is further refined for joining the polar transmitter with the IQ modulator.

For each aspect described in Section A and B, the circuit 210 comprises a Power Amplifier Digital-to-Analog Converter (PA DAC). The PA DAC is configured to generate the supply voltage which is fed to the amplifier.

In one aspect, an update rate of the PA DAC is based on a power consumption requirement, a supported bandwidth of the signal to be transmitted over the wireless channel, an Adjacent Channel Leakage Ratio (ACLR), or a combination thereof.

A. Joining the Polar Transmitter with a Polar Modulator

Figure 4:
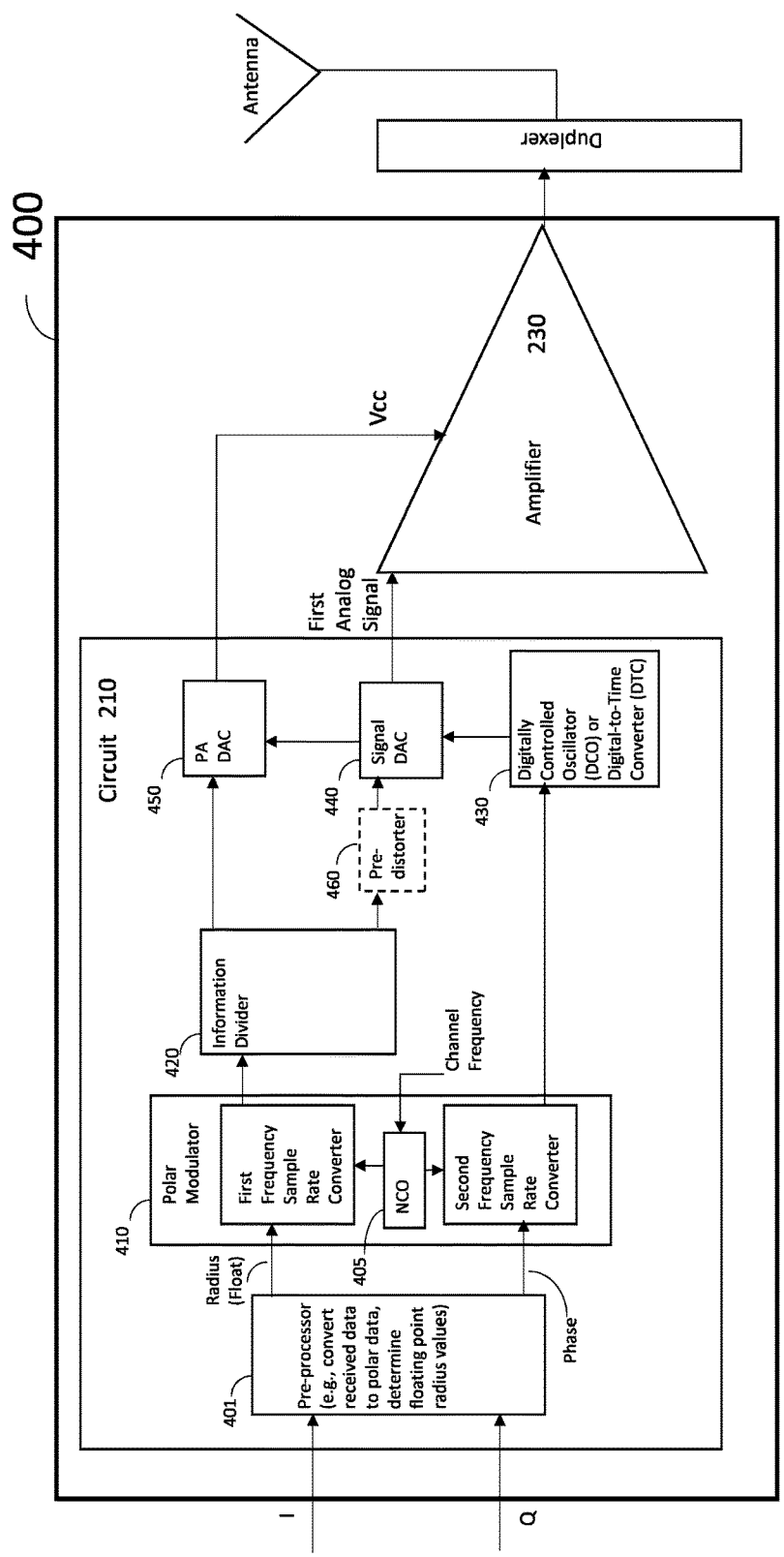
FIG. 4 illustrates an apparatus for joining a polar transmitter with a polar modulator in accordance with an exemplary aspect of the present disclosure.

FIG. 4 illustrates an apparatus 400 for joining a polar transmitter with a polar modulator in accordance with an exemplary aspect of the present disclosure. For example, the apparatus 400 of FIG. 4 comprises the circuit 210, when the circuit 210 is refined for joining the polar modulator and the polar transmitter.

When the type of modulator is a polar modulator, the circuit 210, comprises: an optional preprocessor 401, a polar modulator 410, an information divider 420, a Digitally Controlled Oscillator (DCO) or a Digital-to-Time Converter (DTC) 430, a signal DAC 440, a PA DAC 450, and an optional pre-distorter 460.

The pre-processor 401 is configured to present the received data in an appropriate format, as described above. For example, the pre-processing may comprise converting IQ data to polar data and/or determining floating point radius values.

The polar modulator 410 is configured to modulate a radius and a phase of the received data based on the channel frequency. In one aspect, the polar modulation comprises first and second Frequency Sample Rate Converters (FSRCs). The first FSRC is configured to frequency-sample-rate convert the floating point radius values based on the channel frequency and a desired sample rate. The second FSRC is configured to frequency-sample-rate convert the phase values based on the channel frequency and a desired sample rate. The FSRCs may receive the channel frequency via a Numerically Controlled Oscillator (NCO), e.g., NCO 405.

The information divider 420 is coupled to the polar modulator and configured to divide the modulated radius (i.e., modulated floating point radius values) to the first and second streams.

Figure 5:
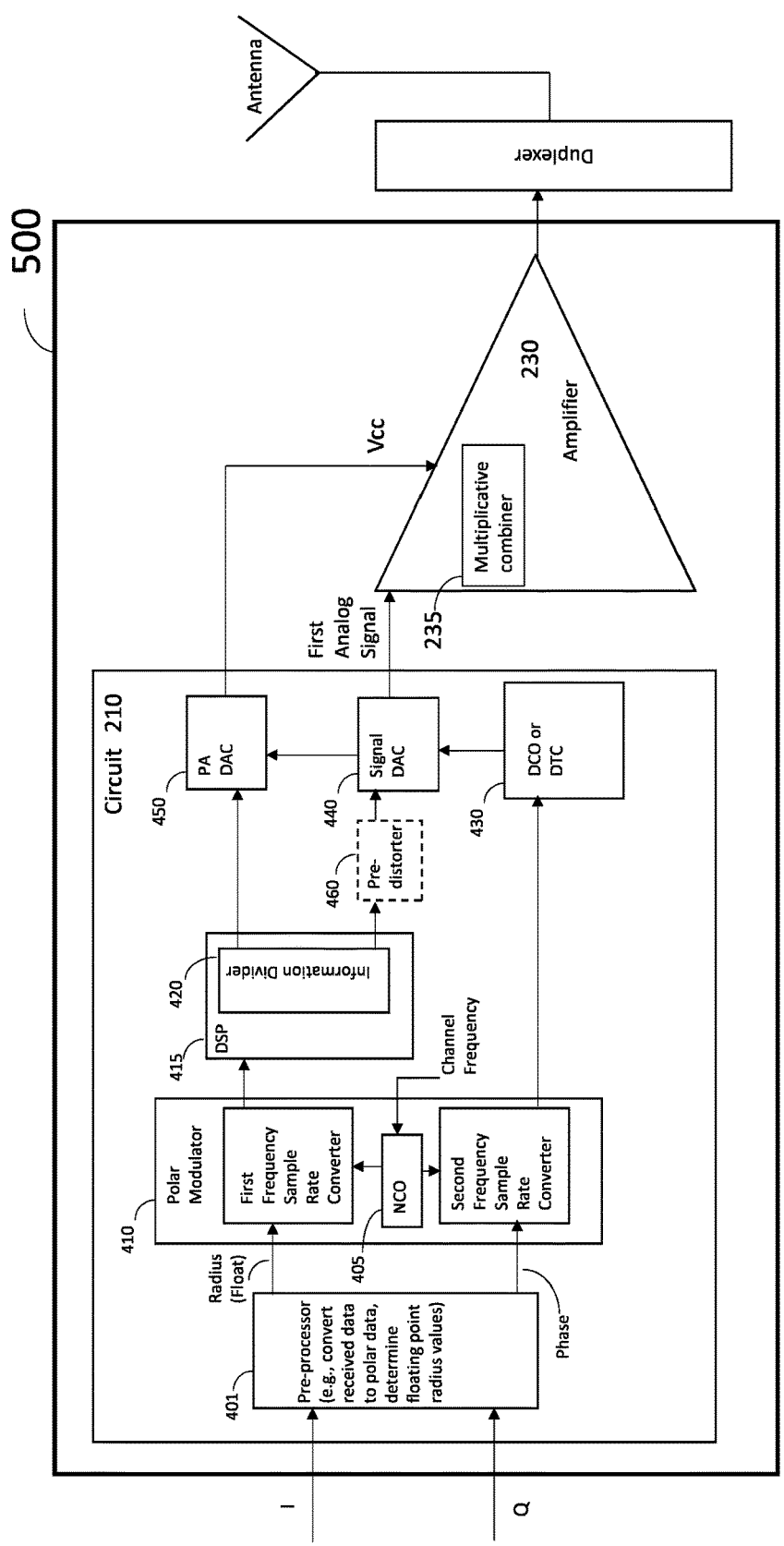
FIG. 5 illustrates an apparatus for joining a polar transmitter with a polar modulator, when the type of combiner is multiplicative and the information divider is configured in a DSP, in accordance with an exemplary aspect of the present disclosure.

In one aspect, the information divider 420 is arranged in a Digital Signal Processor (DSP) 415, as illustrated in FIG. 5.

In one aspect, the first and second streams of data are based on a representation of the modulated floating point radius values using Mantissa numbers and exponents, the first stream comprising a stream of the Mantissa numbers and the second stream comprising a stream of the exponents.

In one aspect, the first and second streams of data are based on a numerical representation of the modulated floating point radius values using Least Significant Bits (LSBs) and Most Significant Bits (MSBs), the first stream comprising a stream of LSBs and the second stream comprising a stream of the MSBs.

In one aspect, the first and second streams of data are based on a representation of the modulated floating point radius values using steps in accordance with first and second step sizes, the first step size being less than the second step size, the first stream comprising a stream of data in accordance with steps of the first step size, and the second stream comprising a stream of data in accordance with steps of the second step size. For example, the first step sizes may be in a range between zero and one. For a non-limiting example, the first step size may be 0, 0.1, 0.2, . . . , 0.9, 1, etc. Similarly, the second step sizes may be built using a power function, e.g., a power of two, a power of 3, etc. For a non-limiting example, the second step size may be $2^0$, $2^1$, $2^2$, . . . , $2^n$.

In one aspect, the first step size may be normalized for a range. For example, steps based on the first step size may be normalized for each range between consecutive steps based on the second step size. For the example above, the steps based on the first step size may be normalized for each range between 1 and 2, between 2 and 4, between 4 and 8, and so on.

In one aspect, the step sizes may be non-equidistance. For example, the steps that are based on the first step size may be: 0, 0.05, 0.1, 0.2, 0.4, 0.7, 1.

The DCO or DTC 430 is coupled to the polar modulator and configured to generate a clock signal based on the channel frequency. The clock signal is distributed to all the DACs. For example, in FIG. 4, the clock signal is shown as being provided to the signal DAC. However, the PA DAC also receives a clock signal through the signal DAC. Alternatively, each DAC may be directly connected to the DCO or DTC.

The signal DAC 440 is coupled to the information divider 420 and configured to generate the first analog signal based on the first stream and the clock signal.

The PA DAC 450 is coupled to the information divider 420 and configured to generate the supply voltage based on the second stream and the clock signal.

It is noted that in an alternative implementation, the PA DAC may not be integrated within circuit 210. For example, the PA DAC may be external to circuit 210, and the circuit 210 may be configured to provide the second stream to the PA DAC. When the PA DAC is external to circuit 210, the clock signal may be directly provided to the PA DAC, rather than through the signal DAC. The PA DAC may then generate the supply voltage based on the directly received clock signal and the second stream received from circuit 210.

The efficiency of the amplifier depends on how closely the power supply tracks the envelope of the received signal. Hence, when the PA DAC is updated more frequently, the efficiency of the amplifier is higher. On the other hand, when the PA DAC is updated less frequently, the envelope information requires lower bandwidth and less current is consumed by the PA DAC.

In one aspect, the present disclosure describes improving the efficiency of the amplifier by having different update rates for the signal DAC and PA DAC. For instance, compared to the signal DAC, the PA DAC may be updated less often. In one aspect, the signal DAC and the PA DAC have different update rates. In another aspect, the signal DAC and the PA DAC have separately adjustable update rates. It is important to note that adjusting the update rates separately may result in having at least some portion of the received data being in both the first and second streams.

In one aspect, the update rate of the signal DAC may be increased to compensate for a decrease in the update rate of the PA DAC. Similarly, the update rate of the signal DAC may be decreased to compensate for an increase in the update rate of the PA DAC.

In one aspect, an integer ratio may be used for the update rates of the PA DAC and signal DAC. For example, the update rate of the PA DAC is divided by an integer N, or the update rate of the signal DAC is multiplied by the integer N. The update rate adjuster is described below in relation with FIG. 9.

In one aspect, the circuit 210 may comprise the pre-distorter 460 configured to pre-distort the first stream and provide a pre-distorted first stream to the signal DAC 440. Then, the signal DAC may generate the first analog signal based on the pre-distorted first stream. For example, suppose the first and second streams of data are based on representation of the modulated floating point radius values using Mantissa numbers and exponents. Then, the pre-distorter 460 is configured to perform AM/AM correction of the Mantissa numbers. The pre-distorted Mantissa numbers may then be provided to the signal DAC 440. The signal DAC 440 generates the first analog signal based on the pre-distorted Mantissa numbers. In other words, in one aspect, the generating of the first analog signal comprises Amplitude Modulation/Amplitude Modulation (AM/AM) correction via the pre-distorter 460.

In one aspect, the pre-distorter 460 is configured to pre-distort the first stream to compensate for a slow response of the PA DAC. For a non-limiting example, the output of the amplifier may take 10-20 nanoseconds to reach a steady state after a signal level of the PA DAC changes. Then, the pre-distortion may be used to compensate for the slow response. Thus, when the pre-distorted first stream is fed to the signal DAC, the output of the amplifier reaches the steady state in a shorter time. For example, the steady state value may be reached in a fraction of the previous time, e.g., 10% of the previous time. Example C3, described in Section "C", illustrates pre-distortion to compensate for a slow response of a PA DAC.

In one aspect, the pre-distorter 460 is configured to calibrate the first analog signal to steps being used for generating the supply voltage. It is noted that a different pre-distorter may be used for each step of the supply voltage, e.g., for each value of Vcc that may be selected and/or measured.

FIG. 5 illustrates an apparatus 500 for joining a polar transmitter with a polar modulator, when the type of combiner is multiplicative and the information divider is configured in a DSP, in accordance with an exemplary aspect of the present disclosure. In one aspect, when the type of modulator is a polar modulator and the type of combiner is multiplicative, the circuit 210 further comprises: the first analog signal and the supply voltage. Then, the amplifier 230 generates the RF signal based on the multiplicatively combined first analog signal and supply voltage. The PA DAC and signal DAC may run using adjustable update rates. For example, a DSP that comprises the information divider may adjust the update rates of the PA DAC and/or signal DAC. It is noted that the update rates may be adjusted separately. In addition, the update rate adjuster may be integrated in the DSP or separate from the DSP.

Figure 6:
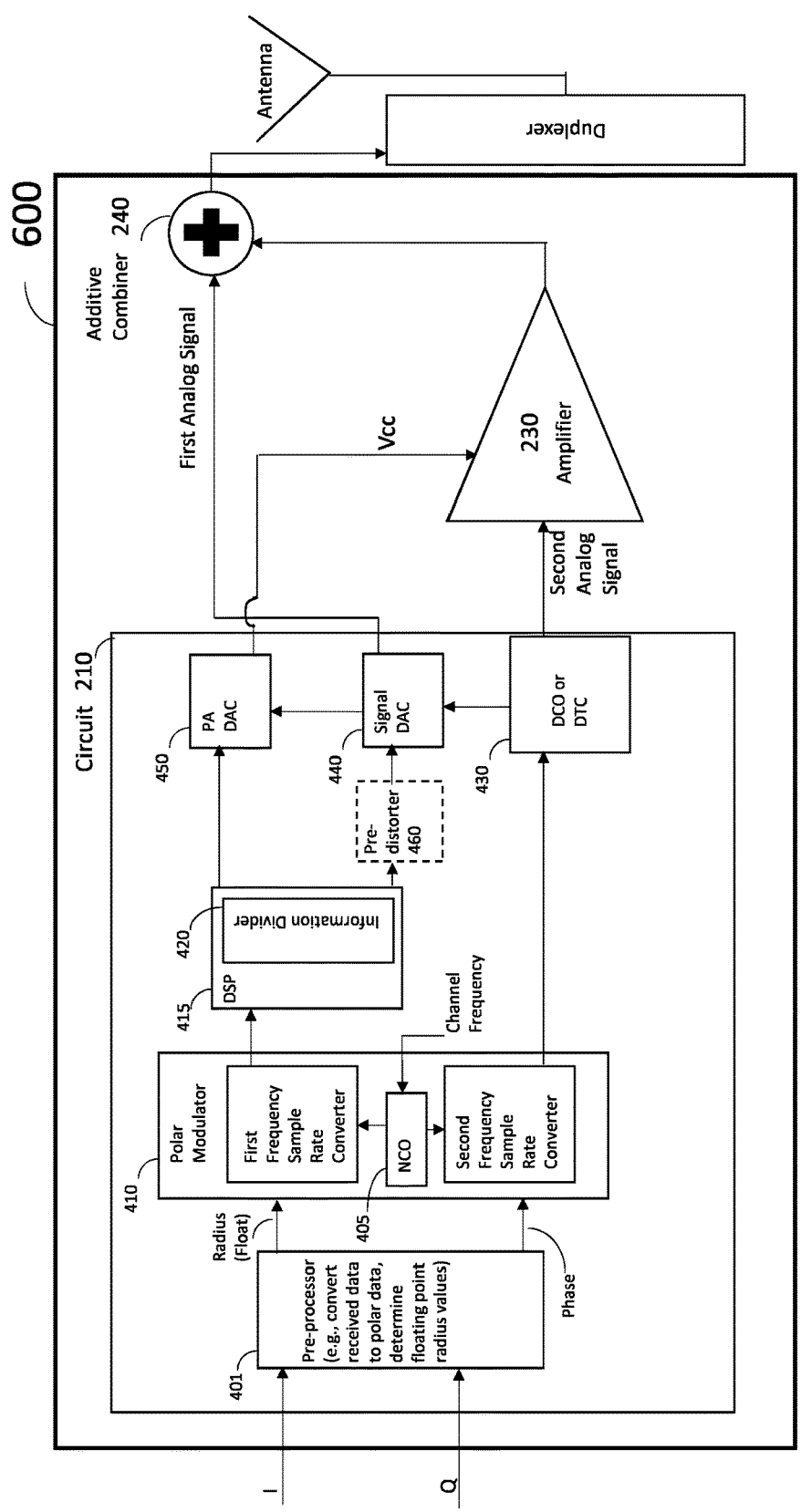
FIG. 6 illustrates an apparatus for joining a polar transmitter with a polar modulator when the type of combiner is additive in accordance with an exemplary aspect of the present disclosure.

FIG. 6 illustrates an apparatus 600 for joining a polar transmitter with a polar modulator when the type of combiner is additive in accordance with an exemplary aspect of the present disclosure. In one aspect, when the type of modulator is a polar modulator and the type of combiner is additive, the circuit 210 further comprises the additive combiner 240. In addition, the DCO or DTC 430 is further configured to generate a second analog signal, the second analog signal having a constant amplitude and being modulated based on the channel frequency. For example, the second analog signal may comprise a clock signal of constant magnitude that is generated via an oscillator and modulated based on the channel frequency. As described above, when the type of combiner is additive, the RF signal is generated based on the supply voltage and the second analog signal. Then, the additive combiner 240 is configured to combine the RF signal generated by the amplifier 230 with the first analog signal.

Figure 7:
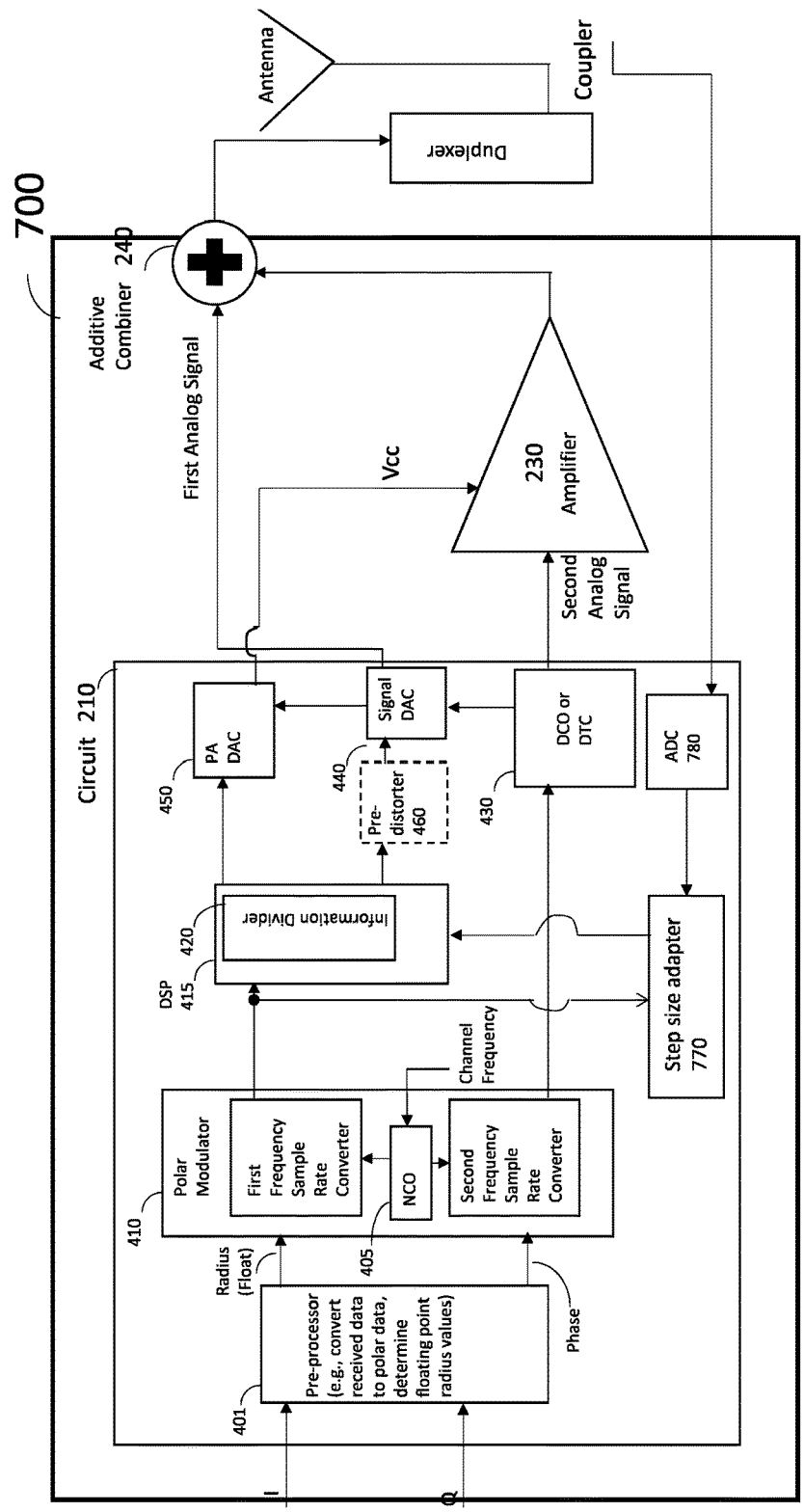
FIG. 7 illustrates an apparatus for joining a polar transmitter with a polar modulator, including a step size adapter, in accordance with an exemplary aspect of the present disclosure.

FIG. 7 illustrates an apparatus 700 for joining a polar transmitter with a polar modulator, including a step size adapter, in accordance with an exemplary aspect of the present disclosure. Recall that the first stream comprises a stream of data in accordance with steps based on the first step size and the second stream comprises a stream of data in accordance with steps based on the second step size. In one aspect, the circuit 210 further comprises a step size adapter 770 coupled to the polar modulator 410 and the DSP 415 (or to the information divider 420).

The step size adapter 770 is configured to receive a desired output power from the polar modulator, to receive an actual (e.g., measured) output power from a duplexer, to compute a first step size and a second step size based on a comparison of the actual and desired output powers, and provide the computed first and second step sizes to the DSP 415 or to the information divider 420. In one aspect, the step size adapter receives the actual output power from the duplexer via an Analog-to-Digital Converter (ADC) 780.

In one aspect, a range of the steps based on the first step size may be larger than a difference of two consecutive steps based on the second step size. This feature provides flexibility for adjusting the steps.

Figure 8:
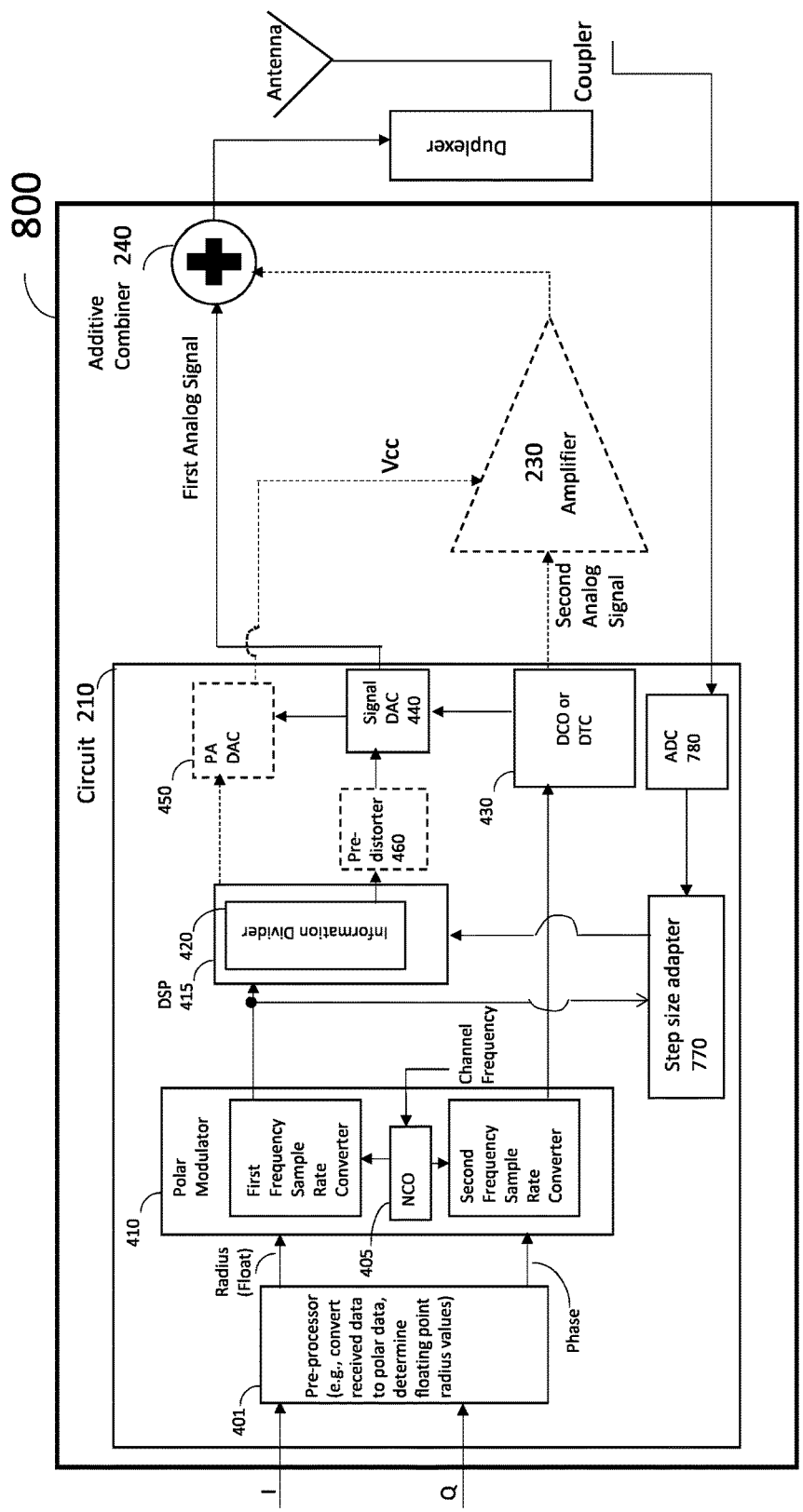
FIG. 8 illustrates the apparatus configured for operating with low power in accordance with an exemplary aspect of the present disclosure.

In the configuration of FIG. 7, suppose the output signal is small. Then, the entire signal may be transmitted via the signal DAC. Then, the PA DAC and the amplifier may be disabled. In addition, the DCO or DTC may terminate the generating of the second analog signal. Thus, the apparatus of FIG. 7 may operate with low power when the signal is small. FIG. 8 illustrates the apparatus 800 configured for operating with low power in accordance with an exemplary aspect of the present disclosure. In other words, FIG. 8 illustrates the apparatus 700 configured (e.g., modified) for low power operation. The components that are disabled while the device is operating in low power mode are illustrated with dash lines.

Figure 9:
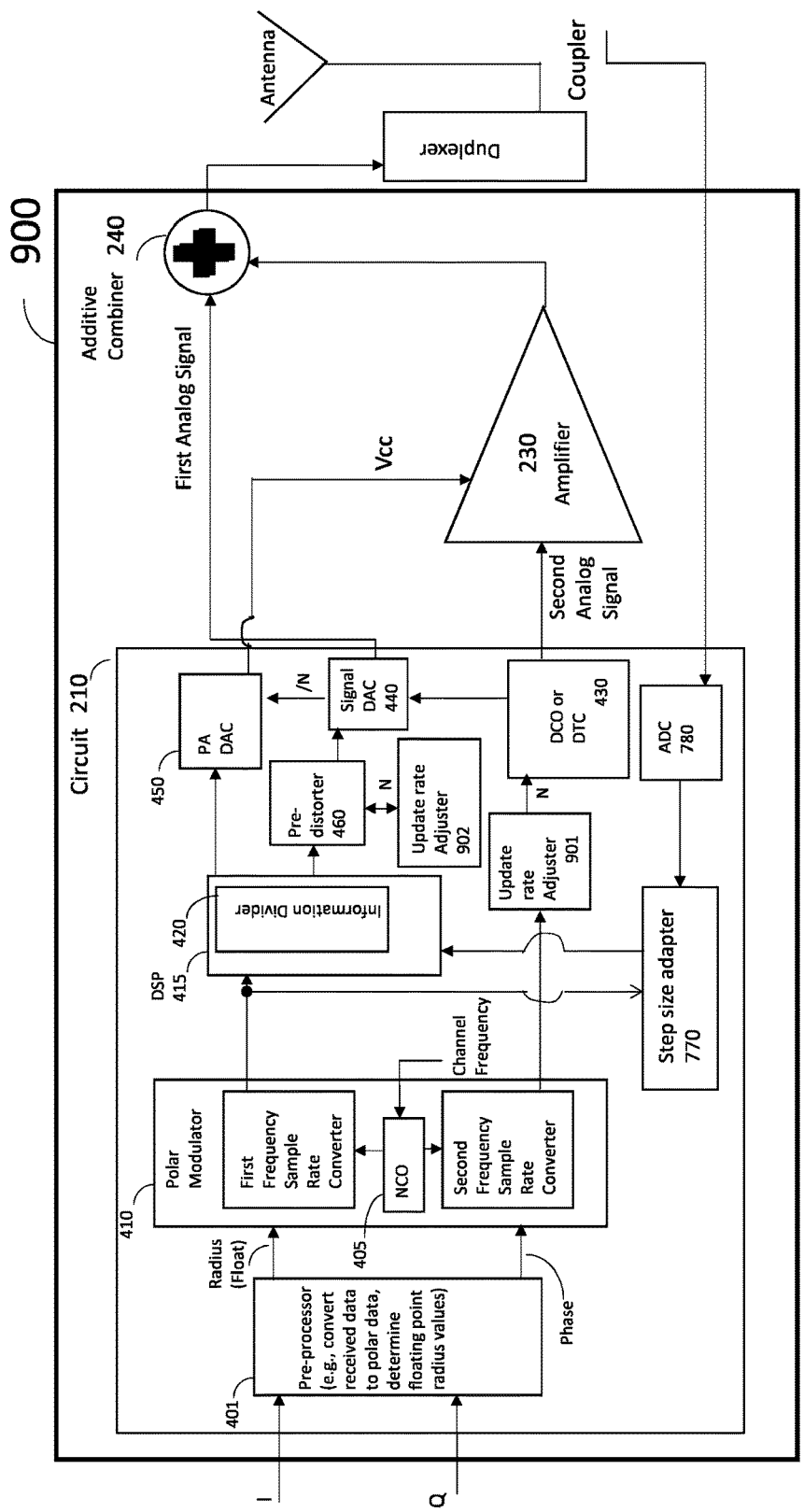
FIG. 9 illustrates an apparatus for joining a polar transmitter with a polar modulator, including a step size adapter, a pre-distorter, and adjustable update rates determined via update rate adjusters, in accordance with an exemplary aspect of the present disclosure.

FIG. 9 illustrates an apparatus 900 for joining a polar transmitter with a polar modulator, including a step size adapter, a pre-distorter, and adjustable update rates determined via update rate adjusters 901 and 902, in accordance with an exemplary aspect of the present disclosure. In one aspect, the update rate adjuster 901 may be used for modifying a rate for generating the second analog signal. In one aspect, the update rate adjuster 902 may be used for modifying a rate that is used to generate the first analog signal. It is important to note that the update rate adjusters 901 and 902 may be integrated in the DSP 415, pre-distorter 460, etc., or implemented separately as shown in FIG. 9.

In one aspect, the update rate of the PA DAC is divided by an integer N. In one aspect, the update rate of the signal DAC is multiplied by the integer N. Similarly, when the DCO or DTC is generating the first analog signal, the update rate of the DCO or DTC is multiplied by the integer N. For example, suppose the PA DAC generates the supply voltage at a slower rate. Then, the signal DAC and the DCO or DTC generate the first and second analog signals, respectively, at a higher rate.

When the update rates of the signal DAC, PA DAC, and DCO or DTC are not the same, the clock signal provided to the signal DAC, PA DAC, and DCO or DTC are adjusted accordingly. For instance, the clock signal of the signal DAC may be divided by N to provide a clock signal to the PA DAC. For clarity, the symbol "↑ N" is used to indicate an increase in an update rate, e.g., by multiplying a sample rate of a clock signal by N. Similarly, the symbol "/N" is used to indicate a decrease in an update rate, e.g., by dividing a sample rate of a clock signal by N. For example, suppose N is two. The sample rate of the clock signal to the signal DAC is doubled. Similarly, the sample rate of the clock signal to the PA DAC may be halved.

B. Joining the Polar Transmitter with an IQ Modulator

Figure 10:
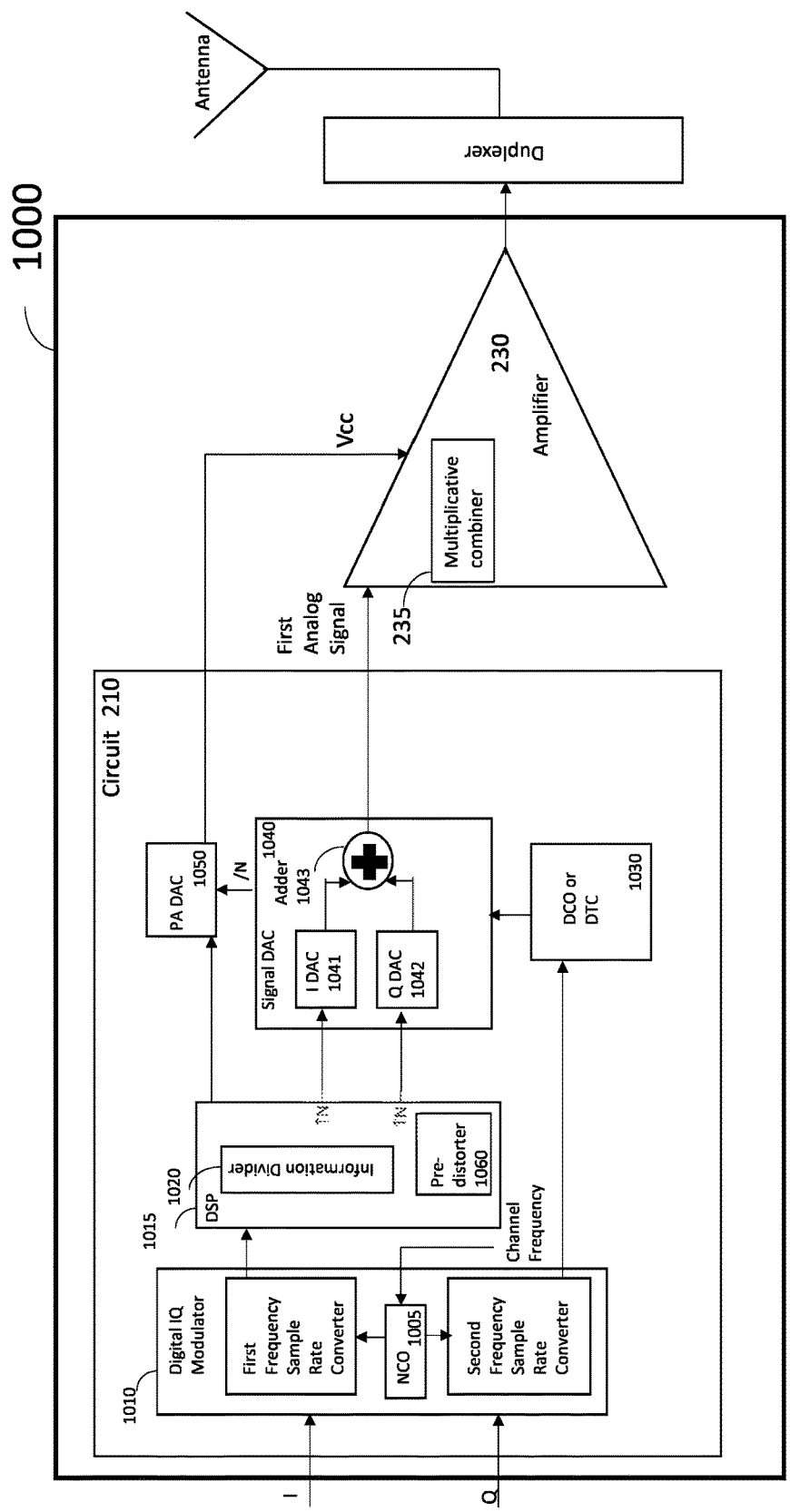
FIG. 10 illustrates an apparatus for joining a digital IQ modulator with a polar transmitter, when the apparatus comprises a multiplicative combiner in accordance with an exemplary aspect of the present disclosure.
Figure 11:
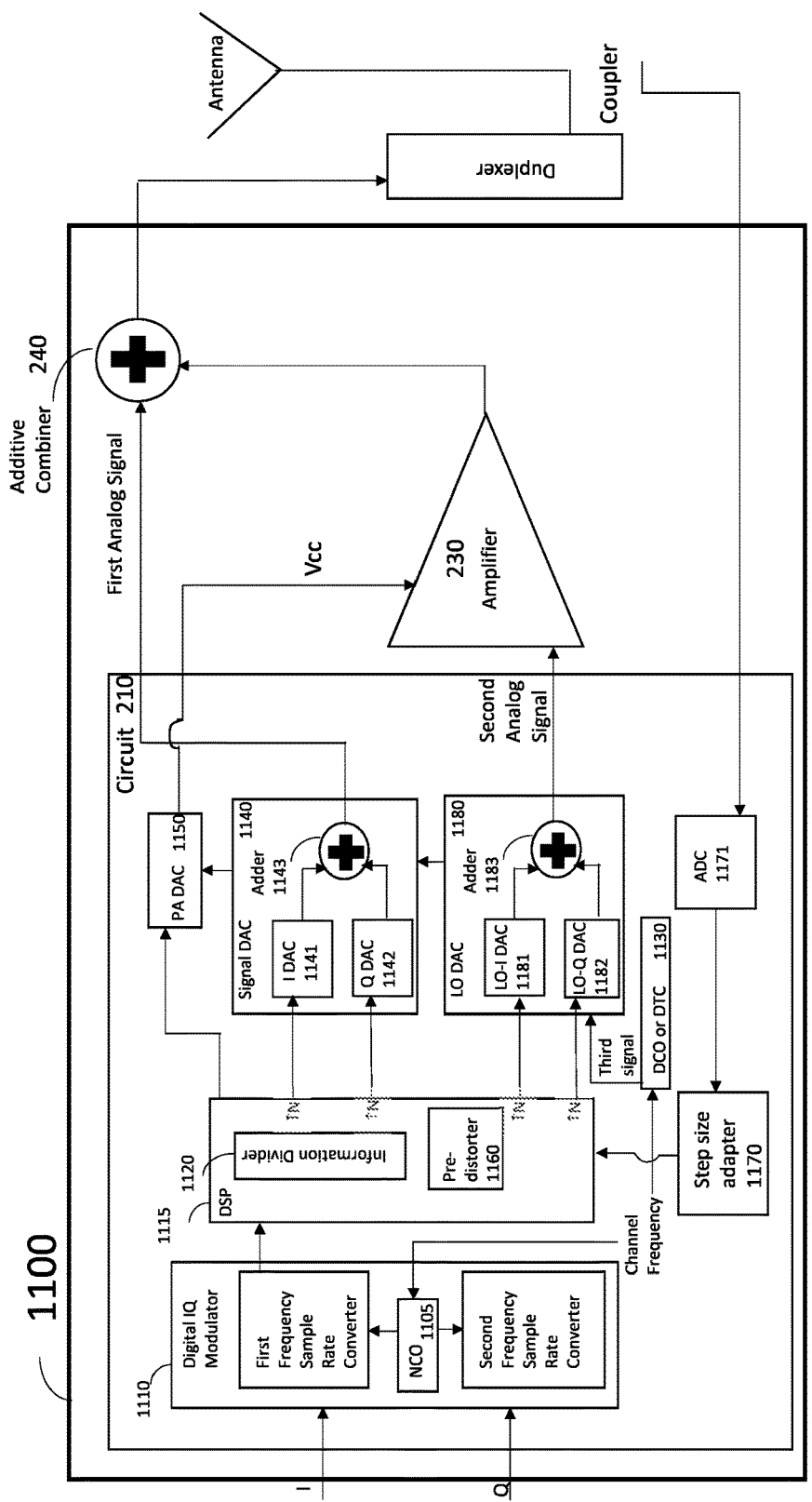
FIG. 11 illustrates an apparatus for joining a digital IQ modulator with a polar transmitter, when the apparatus comprises an additive combiner in accordance with an exemplary aspect of the present disclosure.

In one aspect, the IQ modulator may comprise a digital IQ modulator, an analog IQ modulator or Direct Digital Synthesizer (DDS) modulator. Any of the digital IQ modulators may be used in conjunction with an additive or multiplicative combiner. FIG. 10 and FIG. 11 illustrate an apparatus for joining a digital IQ modulator with the polar transmitter. For clarity, exemplary aspects in regards to the multiplicative and additive combining cases are described herein separately.

FIG. 10 illustrates an apparatus 1000 for joining a digital IQ modulator with a polar transmitter, when the apparatus comprises a multiplicative combiner in accordance with an exemplary aspect of the present disclosure.

When the type of modulator is a digital IQ modulator, the circuit 210, comprises: the digital IQ modulator 1010, a DSP 1015, a DCO or DTC 1030, a signal DAC 1040, and a PA DAC 1050. The signal DAC 1040 comprises an I DAC 1041, a Q DAC 1042 and an adder 1043. The DSP 1015 comprises an information divider 1020 and an optional pre-distorter 1060.

The digital IQ modulator 1010 is configured to modulate in-phase and quadrature components of the received data based on channel frequency. In one aspect, the digital IQ modulator 1010 comprises first and second Frequency Sample Rate Converters (FSRCs). The first FSRC is configured to frequency-sample-rate convert the in-phase component of the received data based on the channel frequency and a desired sample rate. The second FSRC is configured to frequency-sample-rate convert the quadrature component of the received data based on the channel frequency and a desired sample rate. The FSRCs may receive the channel frequency via a Numerically Controlled Oscillator (NCO), e.g., NCO 1005.

The DSP 1015 is coupled to the digital IQ modulator 1010 and configured to: compute a radius from the modulated I and Q components, compute steps in accordance with first and second step sizes, the first step size being less than the second step size, divide the radius and the modulated I and Q components to the first and second streams, wherein the first stream comprises an in-phase stream and a quadrature stream in accordance with the first step size, and the second stream comprises the radius in accordance with the second step size.

The DCO or DTC 1030 is coupled to the digital IQ modulator 1010 and configured to generate a clock signal based on the channel frequency.

The signal DAC 1040 is coupled to the DSP 1015 and configured to generate the first analog signal based on the first stream and the clock signal. In one aspect, generating the first analog signal comprises digital-to-analog converting the in-phase stream by the I DAC 1041, digital-to-analog converting the quadrature stream by the Q DAC 1042, and adding, by the adder 1043, the digital-to-analog converted in-phase and quadrature streams.

The PA DAC 1050 is coupled to the DSP 1015 and configured to generate the supply voltage based on the second stream and the clock signal.

In one aspect, the update rate of the signal DAC 1040 and the update rate of the PA DAC 1050 are adjustable separately. In one aspect, the update rate of the signal DAC 1040 may be increased to compensate for a decrease in the update rate of the PA DAC 1050. Similarly, the update rate of the signal DAC 1040 may be decreased to compensate for an increase in the update rate of the PA DAC 1050.

In one aspect, an integer ratio may be used for the update rates of the PA DAC 1050 and signal DAC 1040. For example, the update rate of the PA DAC may be divided by an integer N, or the update rate of the signal DAC may be multiplied by the integer N.

In one aspect, the DSP 1015 comprises a pre-distorter 1060 configured to pre-distort the first stream to compensate for a slow response of the PA DAC 1050. Thus, the steps sizes, the update rates, compensations or pre-distortions may be computed by the DSP 1015.

In one aspect, the pre-distorter 1060 is further configured to calibrate the first analog signal to steps of the supply voltage.

FIG. 11 illustrates an apparatus 1100 for joining a digital IQ modulator with a polar transmitter, when the apparatus comprises an additive combiner in accordance with an exemplary aspect of the present disclosure.

When the type of modulator is a digital IQ modulator, the circuit 210, comprises: the digital IQ modulator 1110, a DSP 1115, a DCO or DTC 1130, a signal DAC 1140, a PA DAC 1150, an optional step size adapter 1170, a Local Oscillator (LO) DAC 1180, and an additive combiner 240. The signal DAC 1140 comprises an I DAC 1141, a Q DAC 1142 and an adder 1143. The LO DAC 1180 comprises an LO-I DAC 1181, an LO-Q DAC 1182 and an adder 1183. The DSP 1015 comprises an information divider 1120 and an optional pre-distorter 1160.

The digital I and Q modulator 1110 is configured to modulate in-phase and quadrature components of the received data based on channel frequency. In one aspect, the digital IQ modulator 1110 comprises first and second Frequency Sample Rate Converters (FSRCs). The first FSRC is configured to frequency-sample-rate convert the in-phase component of the received data based on the channel frequency and a desired sample rate. The second FSRC is configured to frequency-sample-rate convert the quadrature component of the received data based on the channel frequency and a desired sample rate. The FSRCs may receive the channel frequency via a Numerically Controlled Oscillator (NCO), e.g., NCO 1105.

The DSP 1115 is coupled to the digital IQ modulator 1110 and configured to:
 compute a radius from the modulated I and Q components,
 compute steps in accordance with first and second step sizes, wherein the first step size is less than the second step size,
 compute normalized steps for a Local Oscillator (LO) DAC, and
 divide the radius and the modulated I and Q components to the first and second streams, wherein the first stream comprises an in-phase stream and a quadrature stream in accordance with the first step size and the second stream comprises the radius in accordance with the second step size.

The DCO or DTC 1130 is coupled to the digital IQ modulator 1110 and configured to generate a clock signal based on the channel frequency. In addition, the DCO or DTC 1130 is further configured to generate a second signal having a constant amplitude and being modulated based on the channel frequency. The second signal has in-phase and quadrature components that are fed to LO DAC 1180.

The LO DAC 1180 is coupled to the DSP 1115 and the DCO or DTC 1130, and configured to generate a second analog signal based on the in-phase and quadrature components of the second signal, the clock signal, and normalized steps received from the DSP 1115. For example, normalized steps for the in-phase component is received by LO-I DAC 1181 and normalized steps for the quadrature component is received by LO-Q DAC 1182. In one aspect, generating the second analog signal comprises digital-to-analog converting the in-phase component of the second signal by the LO-I DAC 1181, digital-to-analog converting the quadrature component of the second signal by the Q DAC 1182, and adding, by the adder 1183, the digital-to-analog converted in-phase and quadrature components of the second signal.

The signal DAC 1140 is coupled to the DSP 1115 and configured to generate the first analog signal based on the first stream and the clock signal. In one aspect, generating the first analog signal comprises: digital-to-analog converting the in-phase stream by the I DAC 1141, digital-to-analog converting the quadrature stream by the Q DAC 1142, and adding, by the adder 1143, the digital-to-analog converted in-phase and quadrature streams.

The PA DAC 1150 is coupled to the DSP 1115 and configured to generate the supply voltage based on the second stream and the clock signal.

The optional step size adapter 1170 is configured to: receive a desired output power from the DSP 1115, receive an actual (e.g., measured) output power from a duplexer, compute the step size based on a comparison of the actual and desired output powers, and provide the computed step size to the DSP 1115. The step size that is provided to the DSP is either the first step size or the second step size. The step size adapter receives the actual output power from the duplexer via an analog-to-digital converter 1171.

As described above, when the type of combiner is additive, the RF signal is generated based on the second analog signal and the supply voltage. Then, the additive combiner 240 is configured to combine the RF signal generated by the amplifier 230 with the first analog signal.

In one aspect, the update rate of the signal DAC 1140, the update rate of the PA DAC 1150, and the update rate of the LO DAC 1180 are adjustable separately. In one aspect, the update rates of the signal DAC 1140 and the LO DAC 1180 may be increased to compensate for a decrease in the update rate of the PA DAC 1150. Similarly, the update rate of the signal DAC 1140 and the LO DAC 1180 may be decreased to compensate for an increase in the update rate of the PA DAC 1150.

In one aspect, an integer ratio may be used for the update rates of the PA DAC 1150, signal DAC 1140 and LO DAC 1180. For example, the update rate of the PA DAC is divided by an integer N, or the update rates of the signal DAC and LO DAC are multiplied by the integer N.

In one aspect, the DSP 1115 comprises a pre-distorter 1160 configured to pre-distort the first stream to compensate for a slow response of the PA DAC 1150. Thus, the steps sizes, the update rates, compensations or pre-distortions may be computed by the DSP 1115.

Figure 12:
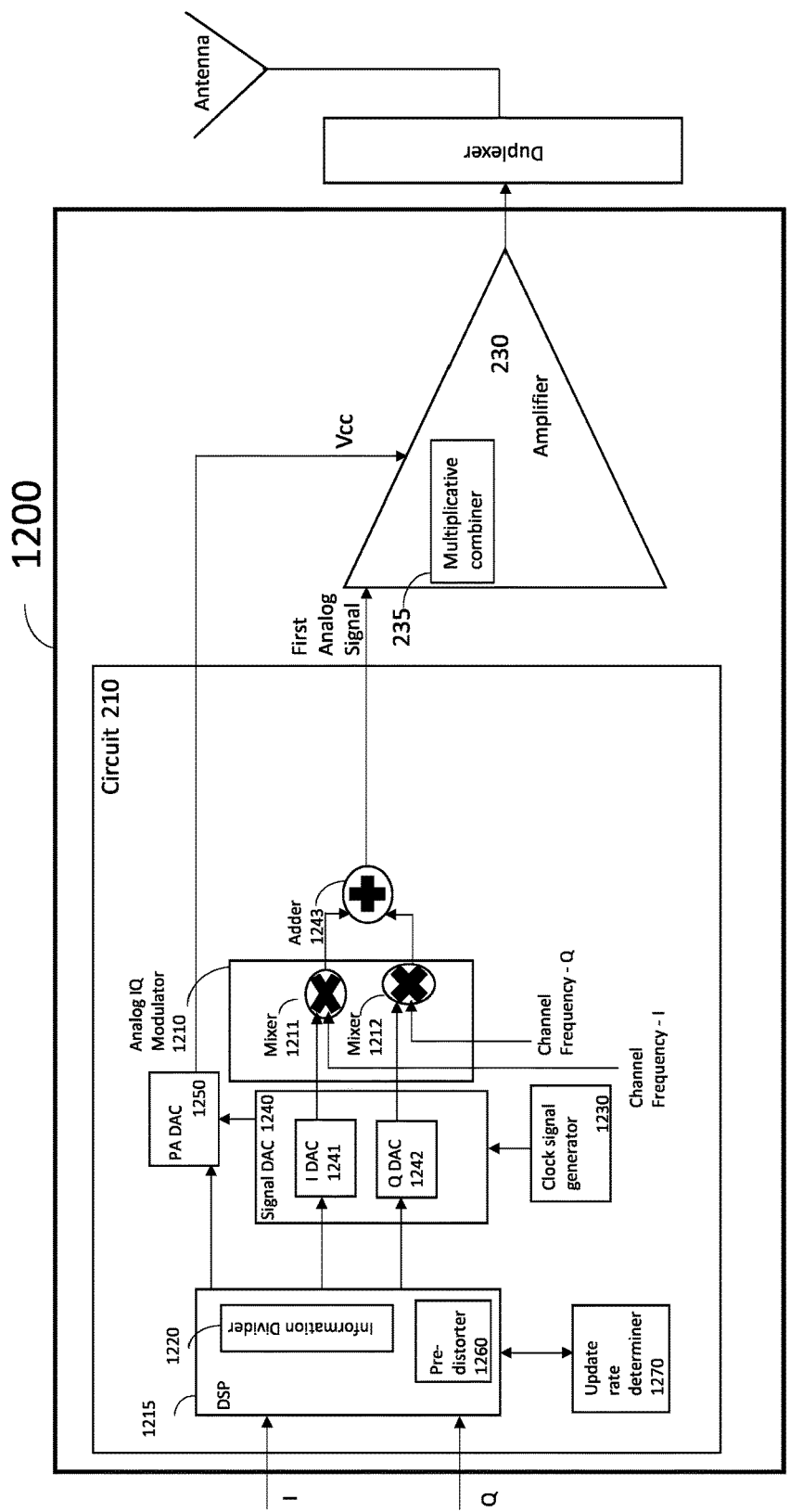
FIG. 12 illustrates an apparatus for joining an analog IQ modulator with a polar transmitter, when the apparatus comprises a multiplicative combiner in accordance with an exemplary aspect of the present disclosure.

FIG. 12 illustrates an apparatus 1200 for joining an analog IQ modulator with a polar transmitter, when the apparatus comprises a multiplicative combiner in accordance with an exemplary aspect of the present disclosure.

When the type of modulator is an analog IQ modulator, the circuit 210, comprises: a DSP 1215, a clock signal generator 1230, a signal DAC 1240, a PA DAC 1250, the analog IQ modulator 1210, an adder 1243, and an optional update rate determiner 1270. In one aspect, the DSP 1215 comprises an information divider 1220 and an optional pre-distorter 1260. In one aspect, the optional update rate determiner 1270 is coupled to the DSP 1215. The signal DAC 1240 comprises an I DAC 1241 and a Q DAC 1242. The analog IQ modulator 1210 comprises mixers 1211 and 1212.

The DSP 1215 is configured to: compute a radius from the IQ data, compute steps in accordance with first and second step sizes wherein the first step size is less than the second step size, and divide the radius and IQ data to the first and second streams, the first stream comprising an in-phase stream and a quadrature stream, and the second stream comprising the radius. The in-phase and quadrature streams are based on representations of the IQ data using the steps in accordance with the first step size. The second stream is based on a representation of radius values using the steps in accordance with the second step size.

The clock signal generator 1230 is configured to generate a clock signal based on a Quartz frequency.

The signal DAC 1240 is coupled to the DSP 1215 and the clock signal generator 1230, and configured to digital-to-analog convert the in-phase and quadrature streams. For example, the signal DAC 1240 is configured to digital-to-analog convert the in-phase stream by the I DAC 1241, and digital-to-analog convert the quadrature stream by the Q DAC 1242.

The analog IQ modulator 1210 is coupled to the signal DAC 1240 and comprises mixers 1211 and 1212. The mixer 1211 is configured to modulate the digital-to-analog converted in-phase stream based on a channel frequency of the in-phase steam. The mixer 1212 is configured to modulate the digital-to-analog converted quadrature stream based on a channel frequency of the quadrature stream.

The adder 1243 is coupled to the analog IQ modulator 1210, and configured to generate the first analog signal based on the sum of the modulated in-phase and quadrature streams.

The PA DAC 1250 is coupled to the DSP 1215 and the clock signal generator 1230, and configured to generate the supply voltage based on the second stream and the clock signal.

In one aspect, the update rate of the signal DAC 1240 and the update rate of the PA DAC 1250 are adjustable separately. In one aspect, the update rate of the signal DAC 1240 may be increased to compensate for a decrease in the update rate of the PA DAC 1250. Similarly, the update rate of the signal DAC 1240 may be decreased to compensate for an increase in the update rate of the PA DAC 1250.

In one aspect, an integer ratio may be used for the update rates of the PA DAC 1250 and signal DAC 1240. For example, the update rate of the PA DAC is divided by an integer N, or the update rate of the signal DAC is multiplied by the integer N.

In one aspect, the DSP 1215 comprises a pre-distorter 1260 configured to pre-distort the first stream to compensate for a slow response of the PA DAC 1250. Thus, in one aspect, the steps sizes, the update rates, compensations or pre-distortions may be computed by the DSP 1215. In one aspect, the update rate is received by the DSP 1215 from an optional update rate determiner 1270.

Figure 13:
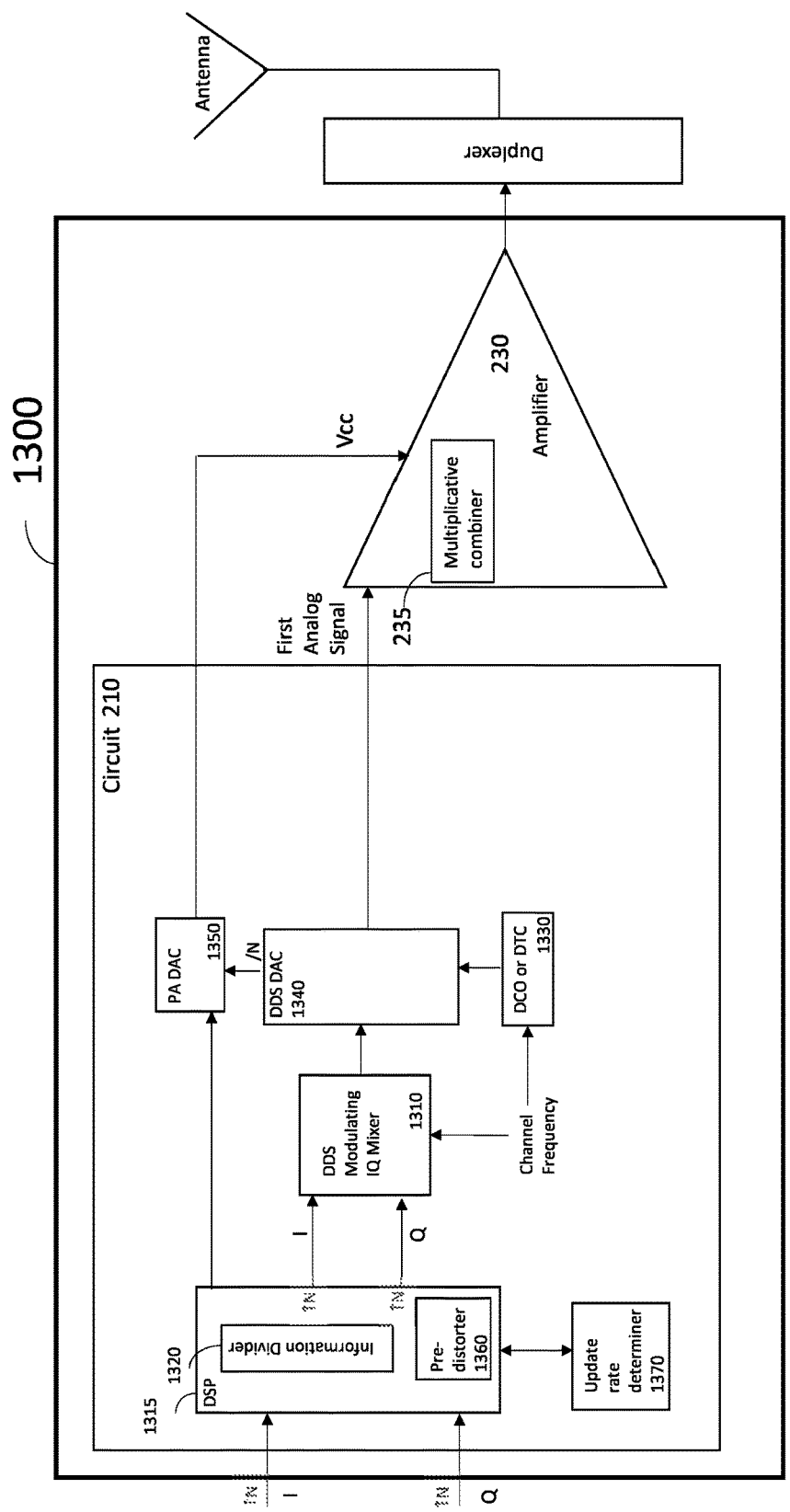
FIG. 13 illustrates an apparatus for joining a DDS modulator with a polar transmitter, when the apparatus comprises a multiplicative combiner in accordance with an exemplary aspect of the present disclosure.

FIG. 13 illustrates an apparatus 1300 for joining a DDS modulator with a polar transmitter, when the apparatus comprises a multiplicative combiner in accordance with an exemplary aspect of the present disclosure.

When the type of modulator is a DDS modulator, the circuit 210, comprises: a DSP 1315, a DCO or DTC 1330, a DDS DAC 1340, a PA DAC 1350, a DDS modulating mixer 1310, an optional update rate determiner 1370. The DSP 1315 comprises an information divider 1320.

The DSP 1315 is coupled to the optional update rate determiner 1370, when applicable, and configured to compute a radius from the IQ data, to divide the radius and IQ data to the first and second streams, the first stream comprising an in-phase stream and a quadrature stream, and the second stream comprising the radius.

In one aspect, the in-phase and quadrature streams are based on representations of the IQ data using steps of a first step size and the second stream is based on a representation of radius values using steps of a second step size, the first step size being less than the second step size.

The DCO or DTC 1330 is configured to generate a clock signal based on a channel frequency.

The DDS modulating mixer 1310, coupled to the DSP 1315, is configured to mix and modulate the in-phase and a quadrature streams based on the channel frequency.

The DDS DAC 1340 is coupled to the DDS modulating mixer 1310 and configured to generate the first analog signal based on the mixed and modulated in-phase and quadrature streams and the clock signal.

The PA DAC 1350 is coupled to the DSP 1315 and the clock signal generator 1330, and configured to generate the supply voltage based on the second stream and the clock signal.

In one aspect, the update rate of the DDS DAC 1340 and the update rate of the PA DAC 1350 are adjustable separately. In one aspect, the update rate of the DDS DAC 1340 may be increased to compensate for a decrease in the update rate of the PA DAC 1350. Similarly, the update rate of the DDS DAC 1340 may be decreased to compensate for an increase in the update rate of the PA DAC 1350.

In one aspect, an integer ratio may be used for the update rates of the PA DAC 1350 and DDS DAC 1340. For example, the update rate of the PA DAC is divided by an integer N, or the update rate of the DDS DAC is multiplied by the integer N.

In one aspect, the DSP 1315 comprises a pre-distorter 1360 configured to pre-distort the first stream to compensate for a slow response of the PA DAC 1350. Thus, in one aspect, the steps sizes, the update rates, compensations or pre-distortions may be computed by the DSP 1315. In one aspect, the update rate is received by the DSP 1315 from an optional update rate determiner 1370.

Figure 14:
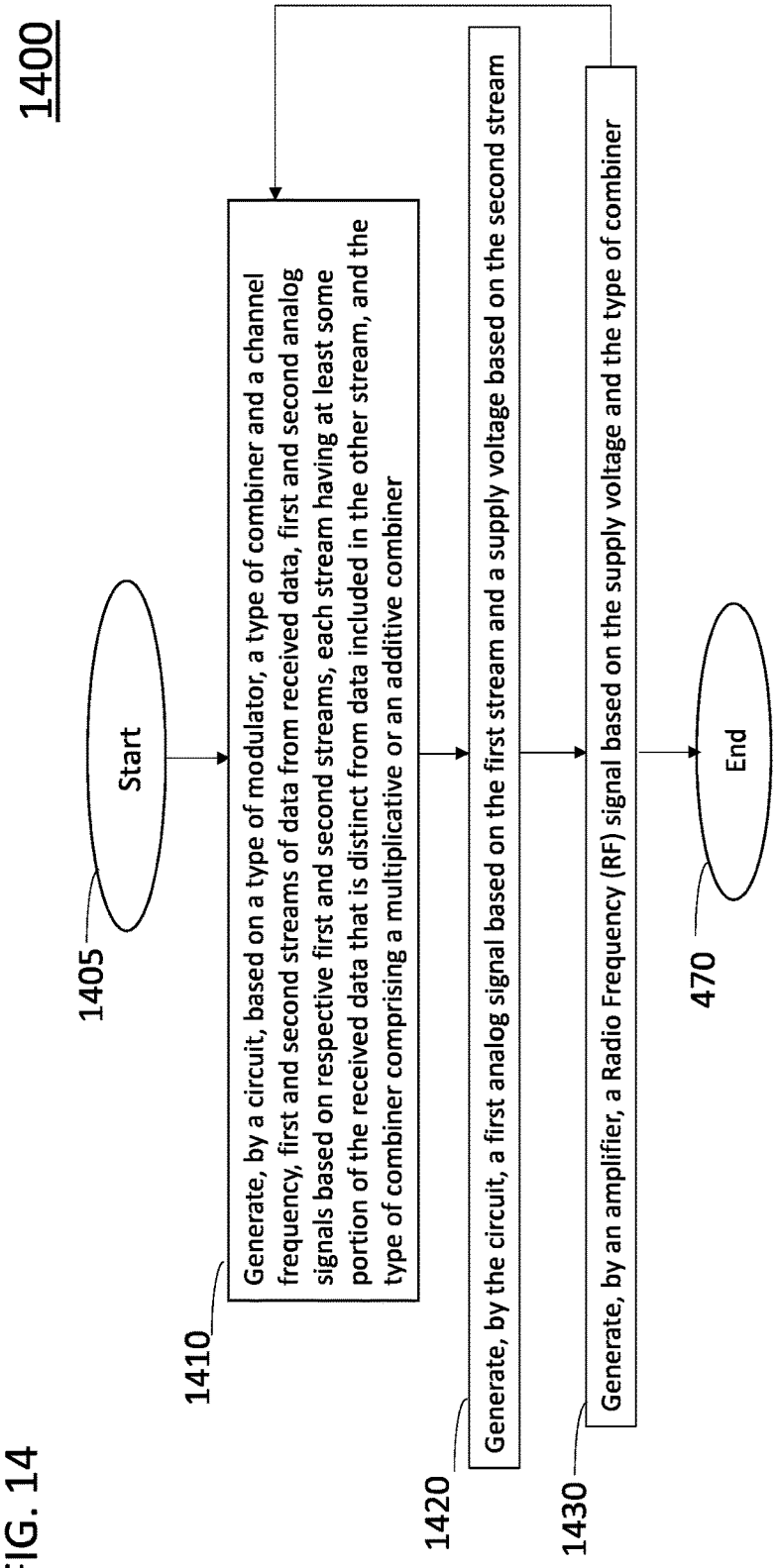
FIG. 14 illustrates a flowchart of an example method for joining a polar transmitter with a modulator in accordance with an exemplary aspect of the present disclosure.

FIG. 14 illustrates a flowchart of an example method 1400 for transmitting a signal over a wireless channel using a device including a polar transmitter joinable with a modulator in accordance with an exemplary aspect of the present disclosure. The operations of the method are not limited to the order described below, and the various operations may be performed in a different order. Further, two or more operations of the method may be performed simultaneously with each other.

In one aspect of the present disclosure, the method 1400 may be implemented in a wireless device that comprises one or more antennas configured to transmit a wireless signal and an apparatus, e.g., apparatus 200. For example, a signal may be transmitted over the wireless channel using a wireless device that comprises the apparatus 200. For example, the method 1400 may be implemented in an apparatus 200 wherein the generating first and second streams of data from received data and generating a first analog signal based on the first stream and generating a supply voltage based on the second stream are performed by circuit 210 of the device, based on a type of modulator, a type of combiner and a channel frequency, and the generating a Radio Frequency (RF) signal based on the supply voltage and the type of combiner is performed by an amplifier 230 of the device, as described above. In another example, the method 1400 may be implemented in a device 1500, described below. The method 1400 starts in at operation 1405 and proceeds to operation 1410.

At operation 1410, the method, by a circuit 210, generates, based on a type of modulator, a type of combiner and a channel frequency, first and second streams of data from received data, each stream having at least some portion of the received data that is distinct from data included in the other stream, the type of combiner comprising a multiplicative or an additive combiner.

At operation 1420, the method, by the circuit 210, generates a first analog signal based on the first stream and generating a supply voltage based on the second stream.

At operation 1430, the method, by an amplifier 230, generates a Radio Frequency (RF) signal based on the supply voltage and the type of combiner.

The method may then proceed to operation 1470 to end the transmitting of the signal or to operation 1405 to receive and process data in accordance with the present disclosure.

Figure 15:
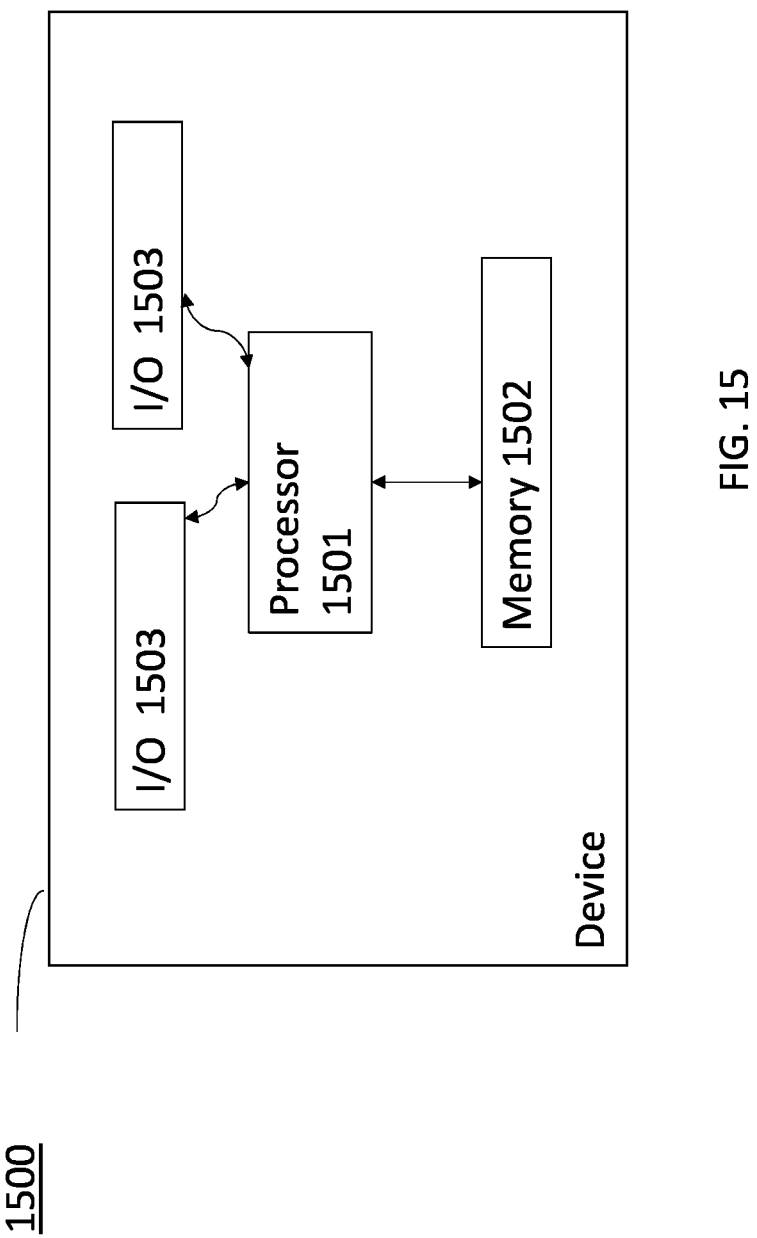
FIG. 15 illustrates a device for performing the functions according to one or more exemplary aspects of the present disclosure.

FIG. 15 illustrates a device 1500 for performing the functions according to one or more exemplary aspects of the present disclosure. The device 1500 comprises a processor 1501 and a memory 1502 configured to store program instructions to be executed by the processor 1501, where executing the program instructions causes the processor 1501 to perform operations for transmitting a signal over a wireless channel using a device including a polar transmitter joinable with a modulator, the operations comprise, generating first and second streams of data from received data based on a type of modulator, a type of combiner and a channel frequency, each stream having at least some portion of the received data that is distinct from data included in the other stream, the type of combiner comprising a multiplicative or an additive combiner, generating a first analog signal based on the first stream and generating a supply voltage based on the second stream, and generating a Radio Frequency (RF) signal based on the supply voltage and the type of combiner. The device 1500 may further comprise any number and type of input/output devices 1503.

It is noted that although FIG. 15 illustrates a single device, the method 1400 may be implemented via any number of devices performing the operations of method 1400 in a distributed manner, serial manner, or a combination thereof. In addition, the devices may be virtualized devices instantiated on servers (e.g., servers of a cloud network). As such, the representation of the hardware components of the device may be a virtualized or a physical representation, without departing from the teaching of the present disclosure. Accordingly, the method 1400 may be implemented in hardware, software, or a combination thereof. It is noted that the processor 1501 executing the program instructions includes the processor 1501 performing the operations of the method 1400 directly or indirectly. For example, the processor 1501 may perform the operations in conjunction with other devices or may direct another device to perform the operations.

It should be understood that the aspects of the present disclosure are described above by way of examples. However, the various aspects are exemplary and not limitations. Thus, the scope of the present disclosure should not be construed as being limited by any of the above aspects or examples. The breadth and the scope of the present disclosure should be defined in accordance with the scope and breadth of the following claims and/or equivalents.

C. Examples

The stream of data to be transmitted may be represented in different ways and processed, e.g., via DACs, amplifier, etc. Then, the processed data is recombined for transmission via an antenna. Examples C1 and C2 illustrate two different ways of combining.

Example C1: A Non-Limiting Illustration of Additive Combining

Suppose the stream of data to be transmitted, e.g., radius values, is to be represented by numbers, e.g., 0, . . . , 255. Then, for additive combining, two streams of data may be generated, the first stream for numbers 0, . . . , 63 and the second stream for 0, 64, 128 and 192. Note that each of the numbers 0, . . . , 255 may be computed by adding a number of the first stream and a number of the second stream. Then, the first stream is used for generating the first analog signal and the second stream is used for generating the supply voltage, i.e., for selecting a value of Vcc.

Example C2: A Non-Limiting Illustration of Multiplicative Combining

Suppose the stream of data to be transmitted, e.g., radius values, is to be represented by numbers {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 132, 136, 140, 144, 148, 152, 156, 160, 164, 168, 172, 176, 180, 184, 188, 192, 196, 200, 204, 208, 212, 216, 220, 224, 228, 232, 236, 240, 244, 248, 252}.

Then, for multiplicative combining, two streams of data may be generated, the first stream for numbers 0, . . . , 63 and the second stream for 0, 1, 2 and 4. Note that each of the above numbers may be computed by multiplying a number of the first stream and a number of the second stream. Note also that double items are thrown away from the above list of numbers. Then, the first stream is used for generating the first analog signal and the second stream is used for generating the supply voltage. The combiner may then determine the appropriate value by multiplying the number of the first stream with a respective number of the second stream. The RF signal may then be generated based on the combined stream. Similar to the additive combining case, the second stream may be used to set the supply voltage level.

Example C3: Execution Examples of Pre-Distortion

FIG. 16A illustrates an execution example of a pre-distortion to compensate for a slow response of a PA DAC, when the combiner is multiplicative, in accordance with an exemplary aspect of the present disclosure.

The compensation for the scenario in which the output of the amplifier jumps from 2.9 to 3.1.

The step response of the PA DAC is illustrated in FIG. 16A-a. As shown, the PA DAC takes about 12 ns for settling.

The Vcc jumps from 3.0V to 3.5V, and the normalized input to the signal DAC (prior to the pre-distortion) jumps from 203/210 to 186/210. The input to the signal DAC without the pre-distortion is illustrated in FIG. 16A-b. The output of the amplifier (without the pre-distorter) is shown in FIG. 16A-d. The input to the signal DAC with the pre-distorter included is illustrated in FIG. 16A-c. The output of the amplifier (with the pre-distorter) is shown in FIG. 16A-e.

The pre-distorter first delivers a jump in the opposite direction for compensation and later decreases to its final value. A comparison of FIG. 16A-d and FIG. 16A-e indicates that the pre-distorter compensates for the slow response of the PA DAC and allows the amplifier to reach its steady state value faster. In other words, in FIG. 16A-e, the amplifier reaches 3.1 in about 2 ns, instead of the 12 ns shown in FIG. 16A-d.

FIG. 16B illustrates an execution example of a pre-distortion to compensate for a slow response of a PA DAC, when the combiner is additive, in accordance with an exemplary aspect of the present disclosure.

The compensation for the scenario in which the output of the amplifier jumps from 3.4 to 3.6.

The step response of the PA DAC is illustrated in FIG. 16B-a. As shown, the PA DAC takes about 12 ns for settling.

The Vcc jumps from 3.0V to 3.5V, and the normalized input to the signal DAC (prior to the pre-distortion) jumps from 0.4 to 0.1. The input to the signal DAC without the pre-distortion is illustrated in FIG. 16B-b. The output of the amplifier (without the pre-distorter) is shown in FIG. 16B-d. The input to the signal DAC with the pre-distorter included is illustrated in FIG. 16B-c. The output of the amplifier (with the pre-distorter) is shown in FIG. 16B-e.

The pre-distorter first delivers a jump in the opposite direction for compensation and later decreases to its final value. A comparison of FIG. 16B-d and FIG. 16B-e indicates that the pre-distorter compensates for the slow response of the PA DAC and allows the amplifier to reach its steady state value faster. In other words, in FIG. 16B-e, the amplifier reaches 3.6 in about 1 ns, instead of the 12 ns shown in FIG. 16B-d.

The following examples pertain to further embodiments.

Example 1 is an apparatus including a polar transmitter joined with a modulator, and operable to transmit a signal over a wireless channel, the apparatus comprising: a circuit configured to, based on a type of modulator, a type of combiner and a channel frequency: generate first and second streams of data from received data, each stream having at least some portion of the received data that is distinct from data included in the other stream, the type of combiner comprising a multiplicative or an additive combiner, and generate a first analog signal based on the first stream and a supply voltage based on the second stream; and an amplifier, coupled to the circuit, and configured to generate a Radio Frequency (RF) signal based on the supply voltage and the type of combiner.

In Example 2, the subject matter of Example, wherein the type of combiner is multiplicative and a multiplicative combiner is arranged to be integrated with the amplifier.

In Example 3, the subject matter of Example 2, wherein: the multiplicative combiner is configured to multiplicatively combine the first analog signal and the supply voltage, and the RF signal is generated based on the multiplicatively combined first analog signal and supply voltage.

In Example 4, the subject matter of Example 1, wherein the type of combiner is additive and an additive combiner is arranged to be coupled to the amplifier.

In Example 5, the subject matter of Example 4, wherein the circuit is further configured to generate a second analog signal, the second analog signal having a constant amplitude, the RF signal being generated based on the supply voltage and the second analog signal, and the additive combiner being configured to add the RF signal with the first analog signal.

In Example 6, the subject matter of Example 1, wherein the circuit further comprises: a Power Amplifier Digital-to-Analog Converter (PA DAC) configured to generate the supply voltage.

In Example 7, the subject matter of Example 6, wherein an update rate of the PA DAC is based on a power consumption requirement, a supported bandwidth of the signal to be transmitted over the wireless channel, or an Adjacent Channel Leakage Ratio (ACLR).

In Example 8, the subject matter of Example 6, wherein, when the type of modulator is a polar modulator, the circuit comprises: the polar modulator configured to modulate a radius and a phase of the received data based on the channel frequency; an information divider, coupled to the polar modulator, and configured to divide the modulated radius to the first and second streams; a Digitally Controlled Oscillator (DCO) or a Digital-to-Time Converter (DTC), coupled to the polar modulator, and configured to generate a clock signal based on the channel frequency; a signal Digital-to-Analog Converter (DAC), coupled to the information divider, and configured to generate the first analog signal based on the first stream and the clock signal; and the PA DAC, coupled to the information divider, and configured to generate the supply voltage based on the second stream and the clock signal.

In Example 9, the subject matter of Example 8, wherein the signal DAC and the PA DAC have different update rates or separately adjustable update rates.

In Example 10, the subject matter of Example 8, further comprising: a pre-distorter, coupled to the information divider, and configured to pre-distort the first stream, the signal DAC generating the first analog signal based on the pre-distorted first stream.

In Example 11, the subject matter of Example 8, wherein the information divider is arranged in a Digital Signal Processor (DSP).

In Example 12, the subject matter of Example 11, wherein: the first and second streams of data are based on representations of modulated floating point radius values using steps in accordance with first and second step sizes, the first step size being less than the second step size, the first stream comprises a stream of data in accordance with steps of the first step size, and the second stream comprises a stream of data in accordance with steps of the second step size.

In Example 13, the subject matter of Example 12, the circuit further comprising: a step size adapter, coupled to the polar modulator, a duplexer and the information divider or DSP, and configured to: receive a desired output power from the polar modulator, receive an actual output power from the duplexer, compute the step size based on a comparison of the actual and desired output powers, and provide the computed step size to the information divider or the DSP, the step size being either the first step size or the second step size.

In Example 14, the subject matter of Example 1, wherein the first and second streams of data are based on representations of modulated floating point radius values using Mantissa numbers and exponents, the first stream comprising a stream of the Mantissa numbers and the second stream comprising a stream of the exponents.

In Example 15, the subject matter of Example 1, wherein the first and second streams of data are based on numerical representation of modulated floating point radius values using Least Significant Bits (LSBs) and Most Significant Bits (MSBs), the first stream comprising a stream of LSBs and the second stream comprising a stream of the MSBs.

In Example 16, the subject matter of Example 6, wherein, when the type of modulator is a digital In-phase and Quadrature (IQ) modulator, the circuit comprises: the digital IQ modulator configured to modulate In-phase (I) and Quadrature (Q) components of the received data based on the channel frequency; a Digital Signal Processor (DSP), coupled to the digital IQ modulator, and configured to: compute a radius from the modulated I and Q components, compute steps in accordance with first and second step sizes, the first step size being less than the second step size, and divide the radius and the modulated I and Q components to the first and second streams, wherein the first stream comprises an in-phase stream and a quadrature stream in accordance with the first step size and the second stream comprises the radius in accordance with the second step size; a Digitally Controlled Oscillator (DCO) or a Digital-to-Time Converter (DTC), coupled to the digital IQ modulator, and configured to generate a clock signal based on the channel frequency; a signal Digital-to-Analog Converter (DAC), coupled to the DSP, and configured to generate the first analog signal based on the first stream and the clock signal, the generating the first analog signal comprising: digital-to-analog converting the in-phase stream using an In-phase (I) DAC; digital-to-analog converting the quadrature stream using a Quadrature (Q) DAC; and adding, by an adder, the digital-to-analog converted in-phase and quadrature streams; and the PA DAC, coupled to the DSP, and configured to generate the supply voltage based on the second stream and the clock signal.

In Example 17, the subject matter of Example 16, wherein the type of combiner is multiplicative, the multiplicative combiner is configured to multiplicatively combine the first analog signal and the supply voltage, and the RF signal is based on the multiplicatively combined first analog signal and the supply voltage.

In Example 18, the subject matter of Example 16, wherein, when the type of combiner is additive: the DSP is further configured to compute normalized steps for a Local Oscillator (LO) DAC; the DCO or DTC is further configured to generate a second signal, the second signal having a constant amplitude and being modulated based on the channel frequency; and the circuit further comprises: the LO DAC, being coupled to the DSP, and configured to generate a second analog signal based on I and Q components of the second signal, the clock signal, and the normalized steps, an additive combiner, coupled to the amplifier and the signal DAC, and configured to combine the RF signal with the first analog signal, the RF signal being generated based on the second analog signal and the supply voltage.

In Example 19, the subject matter of Example 6, wherein, when the type of modulator is an analog IQ modulator, the circuit comprises: a Digital Signal Processor (DSP) configured to: compute a radius from the IQ data, compute steps in accordance with first and second step sizes, the first step size being less than the second step size, and divide the radius and IQ data to the first and second streams, the first stream comprising an in-phase stream and a quadrature stream, and the second stream comprising the radius, the in-phase and quadrature streams being based on representations of the IQ data using the steps in accordance with the first step size, the second stream being based on a representation of radius values using the steps in accordance with the second step size; a clock signal generator configured to generate a clock signal based on a Quartz frequency; a signal DAC, coupled to the DSP and the clock signal generator, and configured to digital-to-analog convert the in-phase and quadrature streams; the analog IQ modulator, coupled to the signal DAC, and configured to modulate the digital-to-analog converted in-phase and quadrature streams based on respective channel frequencies of the in-phase and quadrature streams; an adder, coupled to the analog IQ modulator, and configured to generate the first analog signal based on a sum of the modulated in-phase and quadrature streams; and the PA DAC, coupled to the DSP and the clock signal generator, and configured to generate the supply voltage based on the second stream and the clock signal.

Example 20 is a wireless device, comprising: one or more antennas configured to transmit a signal; and an apparatus including a polar transmitter joined with a modulator, and operable to transmit the signal over a wireless channel, the apparatus comprising: a circuit configured to, based on a type of modulator, a type of combiner and a channel frequency: generate first and second streams of data from received data, each stream having at least some portion of the received data that is distinct from data included in the other stream, the type of combiner comprising a multiplicative or an additive combiner, and generate a first analog signal based on the first stream and a supply voltage based on the second stream; and an amplifier, coupled to the circuit, and configured to generate a Radio Frequency (RF) signal based on the supply voltage and the type of combiner.

In Example 21, the subject matter of Example 20, wherein: when the type of combiner is multiplicative, a multiplicative combiner is arranged to be integrated with the amplifier, the multiplicative combiner being configured to multiplicatively combine the first analog signal and the supply voltage, and the RF signal being generated based on the multiplicatively combined first analog signal and the supply voltage; and when the type of combiner is additive, an additive combiner is arranged to be coupled to the amplifier, the circuit being further configured to generate a second analog signal, the second analog signal having a constant amplitude, the RF signal being generated based on the supply voltage and the second analog signal, and the additive combiner being configured to add the RF signal with the first analog signal.

Example 22 is a method for transmitting a signal over a wireless channel using a device including a polar transmitter joinable with a modulator, the method comprising: generating, by a circuit of the device, first and second streams of data from received data based on a type of modulator, a type of combiner and a channel frequency, each stream having at least some portion of the received data that is distinct from data included in the other stream, the type of combiner comprising a multiplicative or an additive combiner; generating, by the circuit, a first analog signal based on the first stream and generating a supply voltage based on the second stream; and generating, by an amplifier of the device coupled to the circuit, a Radio Frequency (RF) signal based on the supply voltage and the type of combiner.

In Example 23, the subject matter of Example 22, further comprising: when the type of combiner is multiplicative, multiplicatively combining the first analog signal and the supply voltage, by a multiplicative combiner arranged to be integrated with the amplifier, wherein the RF signal is generated based on the multiplicatively combined first analog signal and supply voltage; and when the type of combiner is additive, generating, by the circuit, a second analog signal, the second analog signal having a constant amplitude and the RF signal being based on the second analog signal and the supply voltage, and adding, by an additive combiner arranged to be coupled to the amplifier, the RF signal and the first analog signal.

Example 24 is a device, comprising: a processor; and a memory configured to store a program instructions to be executed by the processor, where executing the program instructions causes the processor to perform operations for joining a polar transmitter with a modulator to transmit a signal over a wireless channel, the operations comprising:

generating, based on a type of modulator, a type of combiner and a channel frequency, first and second streams of data from
received data, each stream having at least some portion of the received data that is distinct from data included in the other stream, and the type of combiner comprising a multiplicative or an additive combiner, and generating a first analog signal based on the first stream and a supply voltage based on the second stream; and generating, a Radio Frequency (RF) signal based on the supply voltage and the type of combiner.

In Example 25, the subject matter of Example 24, the operations further comprising: when the type of combiner is multiplicative, multiplicatively combining the first analog signal and the supply voltage, wherein the RF signal is generated based on the multiplicatively combined first analog signal and supply voltage; and when the type of combiner is additive, generating a second analog signal, the second analog signal having a constant amplitude and the RF signal being based on the second analog signal and the supply voltage, and adding the RF signal and the first analog signal.

Example 26 is a n apparatus including a polar transmitter joined with a modulating means, and operable to transmit a signal over a wireless channel, the apparatus comprising: a circuit configured to, based on a type of modulating means, a type of combining means and a channel frequency: generate first and second streams of data from received data, each stream having at least some portion of the received data that is distinct from data included in the other stream, the type of combining means comprising a multiplicative or an additive combining means, and generate a first analog signal based on the first stream and a supply voltage based on the second stream; and an amplifying means, coupled to the circuit, for generating a Radio Frequency (RF) signal based on the supply voltage and the type of combining means.

In Example 27, the subject matter of Example 26, wherein the type of combining means is multiplicative and a multiplicative combining means is arranged to be integrated with the amplifying means.

In Example 28, the subject matter of Example 27, wherein:
the multiplicative combining means for multiplicatively combining the first analog signal and the supply voltage, and the RF signal is generated based on the multiplicatively combined first analog signal and supply voltage.

In Example 29, the subject matter of Example 26, wherein the type of combining means is additive and an additive combining means is arranged to be coupled to the amplifying means.

In Example 30, the subject matter of Example 29, wherein the circuit is further configured to generate a second analog signal, the second analog signal having a constant amplitude, the RF signal being generated based on the supply voltage and the second analog signal, and the additive combining means for adding the RF signal with the first analog signal.

In Example 31, the subject matter of Example 26, wherein the circuit further comprises: a Power Amplifier Digital-to-Analog Converting means (PA DAC for generating the supply voltage.

In Example 32, the subject matter of Example 31, wherein an update rate of the PA DAC is based on a power consumption requirement, a supported bandwidth of the signal to be transmitted over the wireless channel, or an Adjacent Channel Leakage Ratio (ACLR).

In Example 33, the subject matter of Example 31, wherein, when the type of modulating means is a polar modulating means, the circuit comprises: the polar modulating means if for modulating a radius and a phase of the received data based on the channel frequency; an information dividing means, coupled to the polar modulating means, for dividing the modulated radius to the first and second streams; a Digitally Controlled Oscillator (DCO) or a Digital-to-Time Converter (DTC), coupled to the polar modulating means, for generating a clock signal based on the channel frequency; a signal Digital-to-Analog Converting means (DAC), coupled to the information dividing means, for generating the first analog signal based on the first stream and the clock signal; and the PA DAC, coupled to the information divider, for generating the supply voltage based on the second stream and the clock signal.

In Example 34, the subject matter of Example 33, wherein the signal DAC and the PA DAC have different update rates or separately adjustable update rates.

In Example 35, the subject matter of Example 33, further comprising: a pre-distorting means, coupled to the information divider, for pre-distorting the first stream, the signal DAC generating the first analog signal based on the pre-distorted first stream.

In Example 36, the subject matter of Example 33, wherein the information divider is arranged in a Digital Signal Processor (DSP).

In Example 37, the subject matter of Example 36, wherein: the first and second streams of data are based on representations of modulated floating point radius values using steps in accordance with first and second step sizes, the first step size being less than the second step size, the first stream comprises a stream of data in accordance with steps of the first step size, and the second stream comprises a stream of data in accordance with steps of the second step size.

In Example 38, the subject matter of Example 37, the circuit further comprising: a step size adapting means, coupled to the polar modulating means, a duplexing means and the information dividing means or DSP, and for: receiving a desired output power from the polar modulating means, receiving an actual output power from the duplexer, computing the step size based on a comparison of the actual and desired output powers, and providing the computed step size to the information divider or the DSP, the step size being either the first step size or the second step size.

In Example 39, the subject matter of Example 26, wherein the first and second streams of data are based on representations of modulated floating point radius values using Mantissa numbers and exponents, the first stream comprising a stream of the Mantissa numbers and the second stream comprising a stream of the exponents.

In Example 40, the subject matter of Example 26, wherein the first and second streams of data are based on numerical representation of modulated floating point radius values using Least Significant Bits (LSBs) and Most Significant Bits (MSBs), the first stream comprising a stream of LSBs and the second stream comprising a stream of the MSBs.

In Example 41, the subject matter of Example 31, wherein, when the type of modulating means is a digital In-phase and Quadrature (IQ) modulating means, the circuit comprises: the digital IQ modulating means for modulating In-phase (I) and Quadrature (Q) components of the received data based on the channel frequency; a Digital Signal Processor (DSP), coupled to the digital IQ modulating means, and for: computing a radius from the modulated I and Q components, computing steps in accordance with first and second step sizes, the first step size being less than the second step size, and dividing the radius and the modulated I and Q components to the first and second streams, wherein the first stream comprises an in-phase stream and a quadrature stream in accordance with the first step size and the second stream comprises the radius in accordance with the second step size; a Digitally Controlled Oscillating means (DCO) or a Digital-to-Time Converting means (DTC), coupled to the digital IQ modulating means, for generating a clock signal based on the channel frequency; a signal Digital-to-Analog Converting means (DAC), coupled to the DSP, for generating the first analog signal based on the first stream and the clock signal, the generating the first analog signal comprising: digital-to-analog converting the in-phase stream using an In-phase (I) DAC; digital-to-analog converting the quadrature stream using a Quadrature (Q) DAC; and adding, by an adder, the digital-to-analog converted in-phase and quadrature streams; and the PA DAC, coupled to the DSP, and configured to generate the supply voltage based on the second stream and the clock signal.

In Example 42, the subject matter of Example 41, wherein the type of combining means is multiplicative, the multiplicative combining means for multiplicatively combining the first analog signal and the supply voltage, and the RF signal is based on the multiplicatively combined first analog signal and the supply voltage.

In Example 43, the subject matter of Example 41, wherein, when the type of combining means is additive: the DSP is further for computing normalized steps for a Local Oscillator (LO) DAC; the DCO or DTC is further for generating a second signal, the second signal having a constant amplitude and being modulated based on the channel frequency; and the circuit further comprises: the LO DAC, being coupled to the DSP, and for generating a second analog signal based on I and Q components of the second signal, the clock signal, and the normalized steps, an additive combining means, coupled to the amplifying means and the signal DAC, and for combining the RF signal with the first analog signal, the RF signal being generated based on the second analog signal and the supply voltage.

In Example 44, the subject matter of Example 31, wherein, when the type of modulating means is an analog IQ modulating means, the circuit comprises: a Digital Signal Processor (DSP) for: computing a radius from the IQ data, computing steps in accordance with first and second step sizes, the first step size being less than the second step size, and dividing the radius and IQ data to the first and second streams, the first stream comprising an in-phase stream and a quadrature stream, and the second stream comprising the radius, the in-phase and quadrature streams being based on representations of the IQ data using the steps in accordance with the first step size, the second stream being based on a representation of radius values using the steps in accordance with the second step size; a clock signal generating means for generating a clock signal based on a Quartz frequency; a signal DAC, coupled to the DSP and the clock signal generating means, for digital-to-analog converting the in-phase and quadrature streams; the analog IQ modulating means, coupled to the signal DAC, for modulating the digital-to-analog converted in-phase and quadrature streams based on respective channel frequencies of the in-phase and quadrature streams; an adding means, coupled to the analog IQ modulating means, and for generating the first analog signal based on a sum of the modulated in-phase and quadrature streams; and the PA DAC, coupled to the DSP and the clock signal generating means, for generating the supply voltage based on the second stream and the clock signal.

Example 45 is a wireless device, comprising: one or more antennas configured to transmit a signal; and the Example 26, wherein the signal is to be transmitted over the wireless channel.

In Example 46, the subject matter of Example 45, wherein: when the type of combining means is multiplicative, a multiplicative combining means is arranged to be integrated with the amplifying means, the multiplicative combining means for multiplicatively combining the first analog signal and the supply voltage, and the RF signal being generated based on the multiplicatively combined first analog signal and the supply voltage; and when the type of combining means is additive, an additive combining means is arranged to be coupled to the amplifying means, the circuit being further configured to generate a second analog signal, the second analog signal having a constant amplitude, the RF signal being generated based on the supply voltage and the second analog signal, and the additive combining means being configured to add the RF signal with the first analog signal.

What is claimed is:

1. An apparatus including a polar transmitter joined with a modulator, and operable to transmit a signal over a wireless channel, the apparatus comprising:
   a circuit configured to, based on a type of modulator, a type of combiner and a channel frequency:
   generate first and second streams of data from received data, each stream having at least some portion of the received data that is distinct from data included in the other stream, the type of combiner comprising a multiplicative or an additive combiner, and
   generate a first analog signal based on the first stream and a supply voltage based on the second stream; and
   an amplifier, coupled to the circuit, and configured to generate a Radio Frequency (RF) signal based on the supply voltage and the type of combiner.

2. The apparatus of claim 1, wherein the type of combiner is multiplicative and a multiplicative combiner is arranged to be integrated with the amplifier.

3. The apparatus of claim 2, wherein:
   the multiplicative combiner is configured to multiplicatively combine the first analog signal and the supply voltage, and
   the RF signal is generated based on the multiplicatively combined first analog signal and supply voltage.

4. The apparatus of claim 1, wherein the type of combiner is additive and an additive combiner is arranged to be coupled to the amplifier.

5. The apparatus of claim 4, wherein the circuit is further configured to generate a second analog signal, the second analog signal having a constant amplitude, the RF signal being generated based on the supply voltage and the second analog signal, and the additive combiner being configured to add the RF signal with the first analog signal.

6. The apparatus of claim 1, wherein the circuit further comprises: a Power Amplifier Digital-to-Analog Converter (PA DAC) configured to generate the supply voltage.

7. The apparatus of claim 6, wherein an update rate of the PA DAC is based on a power consumption requirement, a supported bandwidth of the signal to be transmitted over the wireless channel, or an Adjacent Channel Leakage Ratio (ACLR).

8. The apparatus of claim 6, wherein, when the type of modulator is a polar modulator, the circuit comprises:

the polar modulator configured to modulate a radius and a phase of the received data based on the channel frequency;
an information divider, coupled to the polar modulator, and configured to divide the modulated radius to the first and second streams;
a Digitally Controlled Oscillator (DCO) or a Digital-to-Time Converter (DTC), coupled to the polar modulator, and configured to generate a clock signal based on the channel frequency;
a signal Digital-to-Analog Converter (DAC), coupled to the information divider, and configured to generate the first analog signal based on the first stream and the clock signal; and
the PA DAC, coupled to the information divider, and configured to generate the supply voltage based on the second stream and the clock signal.

9. The apparatus of claim 8, wherein the signal DAC and the PA DAC have different update rates or separately adjustable update rates.

10. The apparatus of 8, further comprising:
a pre-distorter, coupled to the information divider, and configured to pre-distort the first stream, the signal DAC generating the first analog signal based on the pre-distorted first stream.

11. The apparatus of claim 8, wherein the information divider is arranged in a Digital Signal Processor (DSP).

12. The apparatus of claim 11, wherein:
the first and second streams of data are based on representations of modulated floating point radius values using steps in accordance with first and second step sizes, the first step size being less than the second step size,
the first stream comprises a stream of data in accordance with steps of the first step size, and
the second stream comprises a stream of data in accordance with steps of the second step size.

13. The apparatus of claim 12, the circuit further comprising:
a step size adapter, coupled to the polar modulator, a duplexer and the information divider or DSP, and configured to:
receive a desired output power from the polar modulator,
receive an actual output power from the duplexer,
compute the step size based on a comparison of the actual and desired output powers, and
provide the computed step size to the information divider or the DSP, the step size being either the first step size or the second step size.

14. The apparatus of claim 1, wherein the first and second streams of data are based on representations of modulated floating point radius values using Mantissa numbers and exponents, the first stream comprising a stream of the Mantissa numbers and the second stream comprising a stream of the exponents.

15. The apparatus of claim 1, wherein the first and second streams of data are based on numerical representation of modulated floating point radius values using Least Significant Bits (LSBs) and Most Significant Bits (MSBs), the first stream comprising a stream of LSBs and the second stream comprising a stream of the MSBs.

16. The apparatus of claim 6, wherein, when the type of modulator is a digital In-phase and Quadrature (IQ) modulator, the circuit comprises:

the digital IQ modulator configured to modulate In-phase (I) and Quadrature (Q) components of the received data based on the channel frequency;
a Digital Signal Processor (DSP), coupled to the digital IQ modulator, and configured to:
compute a radius from the modulated I and Q components,
compute steps in accordance with first and second step sizes, the first step size being less than the second step size, and
divide the radius and the modulated I and Q components to the first and second streams, wherein the first stream comprises an in-phase stream and a quadrature stream in accordance with the first step size and the second stream comprises the radius in accordance with the second step size;
a Digitally Controlled Oscillator (DCO) or a Digital-to-Time Converter (DTC), coupled to the digital IQ modulator, and configured to generate a clock signal based on the channel frequency;
a signal Digital-to-Analog Converter (DAC), coupled to the DSP, and configured to generate the first analog signal based on the first stream and the clock signal, the generating the first analog signal comprising:
digital-to-analog converting the in-phase stream using an In-phase (I) DAC;
digital-to-analog converting the quadrature stream using a Quadrature (Q) DAC; and
adding, by an adder, the digital-to-analog converted in-phase and quadrature streams; and
the PA DAC, coupled to the DSP, and configured to generate the supply voltage based on the second stream and the clock signal.

17. The apparatus of claim 16, wherein the type of combiner is multiplicative, the multiplicative combiner is configured to multiplicatively combine the first analog signal and the supply voltage, and the RF signal is based on the multiplicatively combined first analog signal and the supply voltage.

18. The apparatus of claim 16, wherein, when the type of combiner is additive:
the DSP is further configured to compute normalized steps for a Local Oscillator (LO) DAC;
the DCO or DTC is further configured to generate a second signal, the second signal having a constant amplitude and being modulated based on the channel frequency; and
the circuit further comprises:
the LO DAC, being coupled to the DSP, and configured to generate a second analog signal based on I and Q components of the second signal, the clock signal, and the normalized steps,
an additive combiner, coupled to the amplifier and the signal DAC, and configured to combine the RF signal with the first analog signal, the RF signal being generated based on the second analog signal and the supply voltage.

19. The apparatus of claim 6, wherein, when the type of modulator is an analog IQ modulator, the circuit comprises:
a Digital Signal Processor (DSP) configured to:
compute a radius from the IQ data,
compute steps in accordance with first and second step sizes, the first step size being less than the second step size, and
divide the radius and IQ data to the first and second streams, the first stream comprising an in-phase stream and a quadrature stream, and the second stream comprising the radius, the in-phase and quadrature streams being based on representations of the IQ data using the steps in accordance with the first step size, the second stream being based on a representation of radius values using the steps in accordance with the second step size;

a clock signal generator configured to generate a clock signal based on a Quartz frequency;

a signal DAC, coupled to the DSP and the clock signal generator, and configured to digital-to-analog convert the in-phase and quadrature streams;

the analog IQ modulator, coupled to the signal DAC, and configured to modulate the digital-to-analog converted in-phase and quadrature streams based on respective channel frequencies of the in-phase and quadrature streams;

an adder, coupled to the analog IQ modulator, and configured to generate the first analog signal based on a sum of the modulated in-phase and quadrature streams; and the PA DAC, coupled to the DSP and the clock signal generator, and configured to generate the supply voltage based on the second stream and the clock signal.

20. A wireless device, comprising:
one or more antennas configured to transmit a signal; and
an apparatus including a polar transmitter joined with a modulator, and operable to transmit the signal over a wireless channel, the apparatus comprising:
  a circuit configured to, based on a type of modulator, a type of combiner and a channel frequency:
    generate first and second streams of data from received data, each stream having at least some portion of the received data that is distinct from data included in the other stream, the type of combiner comprising a multiplicative or an additive combiner, and
    generate a first analog signal based on the first stream and a supply voltage based on the second stream; and
  an amplifier, coupled to the circuit, and configured to generate a Radio Frequency (RF) signal based on the supply voltage and the type of combiner.

21. The wireless device of claim 20, wherein:
when the type of combiner is multiplicative, a multiplicative combiner is arranged to be integrated with the amplifier, the multiplicative combiner being configured to multiplicatively combine the first analog signal and the supply voltage, and the RF signal being generated based on the multiplicatively combined first analog signal and the supply voltage; and
when the type of combiner is additive, an additive combiner is arranged to be coupled to the amplifier, the circuit being further configured to generate a second analog signal, the second analog signal having a constant amplitude, the RF signal being generated based on the supply voltage and the second analog signal, and the additive combiner being configured to add the RF signal with the first analog signal.

22. A method for transmitting a signal over a wireless channel using a device including a polar transmitter joinable with a modulator, the method comprising:

generating, by a circuit of the device, first and second streams of data from received data based on a type of modulator, a type of combiner and a channel frequency, each stream having at least some portion of the received data that is distinct from data included in the other stream, the type of combiner comprising a multiplicative or an additive combiner;

generating, by the circuit, a first analog signal based on the first stream and generating a supply voltage based on the second stream; and generating, by an amplifier of the device coupled to the circuit, a Radio Frequency (RF) signal based on the supply voltage and the type of combiner.

23. The method of claim 22, further comprising:
when the type of combiner is multiplicative, multiplicatively combining the first analog signal and the supply voltage, by a multiplicative combiner arranged to be integrated with the amplifier, wherein the RF signal is generated based on the multiplicatively combined first analog signal and supply voltage; and
when the type of combiner is additive, generating, by the circuit, a second analog signal, the second analog signal having a constant amplitude and the RF signal being based on the second analog signal and the supply voltage, and adding, by an additive combiner arranged to be coupled to the amplifier, the RF signal and the first analog signal.

24. A device, comprising:
a processor; and
a memory configured to store a program instructions to be executed by the processor, where executing the program instructions causes the processor to perform operations for joining a polar transmitter with a modulator to transmit a signal over a wireless channel, the operations comprising:
  generating, based on a type of modulator, a type of combiner and a channel frequency, first and second streams of data from received data, each stream having at least some portion of the received data that is distinct from data included in the other stream, and the type of combiner comprising a multiplicative or an additive combiner, and
  generating a first analog signal based on the first stream and a supply voltage based on the second stream; and
  generating, a Radio Frequency (RF) signal based on the supply voltage and the type of combiner.

25. The device of claim 24, the operations further comprising:
when the type of combiner is multiplicative, multiplicatively combining the first analog signal and the supply voltage, wherein the RF signal is generated based on the multiplicatively combined first analog signal and supply voltage; and
when the type of combiner is additive, generating a second analog signal, the second analog signal having a constant amplitude and the RF signal being based on the second analog signal and the supply voltage, and adding the RF signal and the first analog signal.

* * * * *